United States Patent
Ahmed

(10) Patent No.: US 11,282,963 B2
(45) Date of Patent: Mar. 22, 2022

(54) LOW TEMPERATURE THIN FILM TRANSISTORS AND MICRO LIGHTEMITTING DIODE DISPLAYS HAVING LOW TEMPERATURE THIN FILM TRANSISTORS

(71) Applicant: Intel Corporation, Santa Clara, CA (US)

(72) Inventor: Khaled Ahmed, Anaheim, CA (US)

(73) Assignee: Intel Corporation, Santa Clara, CA (US)

( * ) Notice: Subject to any disclaimer, the term of this patent is extended or adjusted under 35 U.S.C. 154(b) by 722 days.

(21) Appl. No.: 16/049,394

(22) Filed: Jul. 30, 2018

(65) Prior Publication Data
US 2020/0035837 A1   Jan. 30, 2020

(51) Int. Cl.
*H01L 29/786* (2006.01)
*H01L 29/20* (2006.01)
*H01L 27/15* (2006.01)
*H01L 27/12* (2006.01)

(52) U.S. Cl.
CPC .... *H01L 29/78681* (2013.01); *H01L 27/1225* (2013.01); *H01L 27/156* (2013.01); *H01L 29/20* (2013.01)

(58) Field of Classification Search
CPC ....... H01L 29/20; H01L 29/78; H01L 29/786; H01L 29/7868; H01L 29/78681; H01L 27/12; H01L 27/122; H01L 27/1225; H01L 27/15; H01L 27/156
USPC .......................................................... 257/72
See application file for complete search history.

(56) References Cited

U.S. PATENT DOCUMENTS 9,184,300 B2 * 11/2015 Son ................... H01L 29/78618

* cited by examiner

*Primary Examiner* — Monica D Harrison
(74) *Attorney, Agent, or Firm* — Schwabe, Williamson & Wyatt, P.C.

(57) ABSTRACT

Low temperature thin film transistors and micro light-emitting diode displays having low temperature thin film transistors are described. In an example, an integrated circuit structure includes a gate electrode on an insulator structure. A channel material layer is over the gate electrode and extends beyond a first side and a second side of the gate electrode. The channel material layer includes a crystalline Group III-P material. A first conductive contact is on a portion of the channel material layer extending beyond the first side of the gate electrode. A second conductive contact is on a portion of the channel material layer extending beyond the second side of the gate electrode.

24 Claims, 15 Drawing Sheets

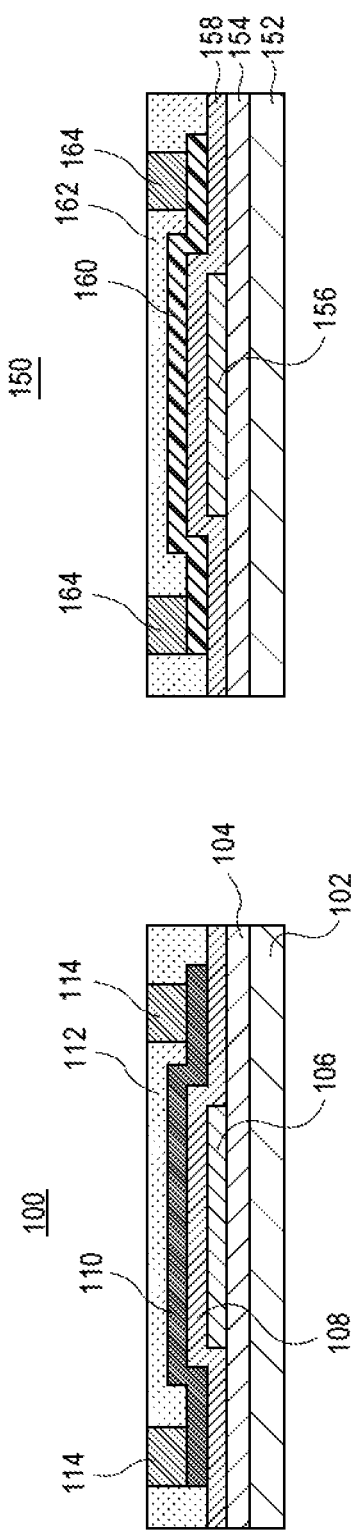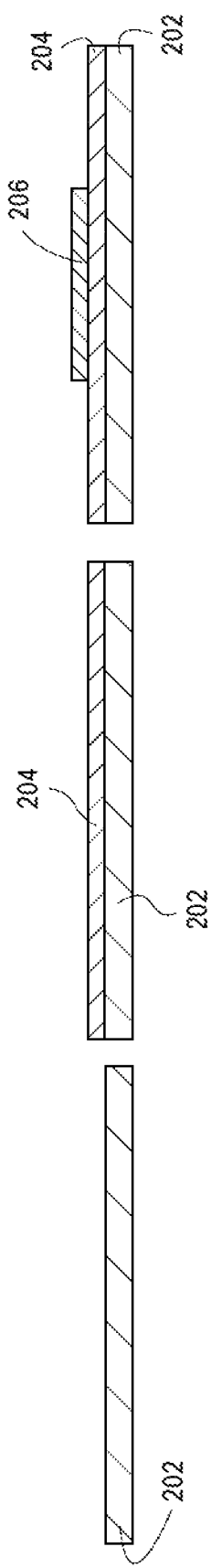
FIG. 1
FIG. 2A  FIG. 2B  FIG. 2C

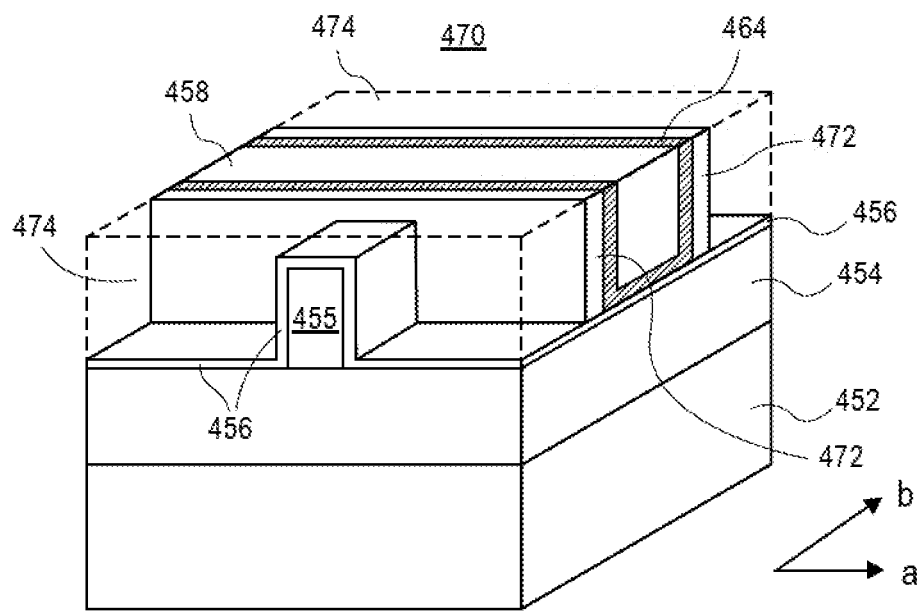
FIG. 4C
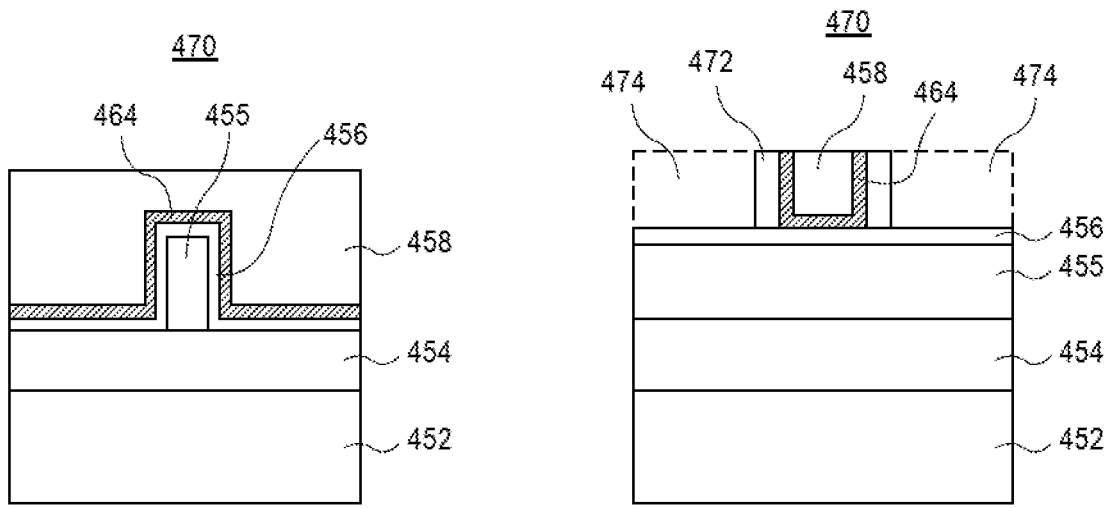
FIG. 4D     FIG. 4E

US 11,282,963 B2

LOW TEMPERATURE THIN FILM TRANSISTORS AND MICRO LIGHTEMITTING DIODE DISPLAYS HAVING LOW TEMPERATURE THIN FILM TRANSISTORS

TECHNICAL FIELD

Embodiments of the disclosure are in the field of integrated circuit structures and, in particular, low temperature thin film transistors and micro light-emitting diode displays having low temperature thin film transistors.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

The performance of a thin-film transistor (TFT) may depend on a number of factors. For example, the efficiency at which a TFT is able to operate may depend on the sub threshold swing of the TFT, characterizing the amount of change in the gate-source voltage needed to achieve a given change in the drain current. A smaller sub threshold swing enables the TFT to turn off to a lower leakage value when the gate-source voltage drops below the threshold voltage of the TFT. The conventional theoretical lower limit at room temperature for the sub threshold swing of the TFT is 60 millivolts per decade of change in the drain current.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

In another aspect, displays having micro-scale light-emitting diodes (LEDs) are known as micro-LED, mLED, and μLED. As the name implies, micro-LED displays have arrays of micro-LEDs forming the individual pixel elements.

A pixel may be a minute area of illumination on a display screen, one of many from which an image is composed. In other words, pixels may be small discrete elements that together constitute an image as on a display. These primarily square or rectangular-shaped units may be the smallest item of information in an image. Pixels are normally arranged in a two-dimensional (2D) matrix, and are represented using dots, squares, rectangles, or other shapes. Pixels may be the basic building blocks of a display or digital image and with geometric coordinates.

BRIEF DESCRIPTION OF THE DRAWINGS

FIG. 1 illustrates cross-sectional views of (a) a thin film transistor (TFT) having an indium gallium zinc oxide (IGZO) channel material layer and (b) a thin film transistor (TFT) having a channel material layer including a crystalline Group III-P material, in accordance with an embodiment of the present disclosure.

FIGS. 2A-2H illustrate cross-sectional views representing various operations in a process of fabricating a thin film transistor (TFT), in accordance with an embodiment of the present disclosure.

FIGS. 4C, 4D, and 4E illustrate angled and direct cross-sectional views of a thin film integrated circuit structure having relatively increased width, in accordance with an embodiment of the present disclosure.

DESCRIPTION OF THE EMBODIMENTS

Figure 2D:
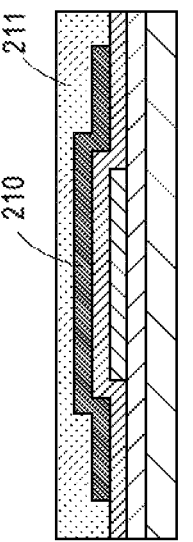

Low temperature thin film transistors and micro light-emitting diode displays having low temperature thin film transistors are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating low temperature thin film transistors for display backplanes. One or more embodiments may be implemented to realize high performance backend transistors.

To provide context for one aspect of the disclosure, there is increased need for advanced system on chip (SoCs) to include monolithically integrated BEOL transistors for logic functionality at higher metal layers. Such BEOL transistors typically have a lower thermal budget than front end transistors due to increased thermal sensitivity of backend materials. Also, the performance of such transistors may be severely hampered due to low channel mobility for BEOL-compatible channel materials such as indium gallium zinc oxide (IGZO). To provide context for another aspect of the disclosure, since IGZO thin film transistors (TFTs) may be prone to threshold voltage shift under prolonged electrical stress, their current-voltage characteristics may change, which may alter data current by more than 60% in a conventional pixel circuit.

In accordance with one or more embodiments of the present disclosure, pixel circuits based on N-channel crystalline or polycrystalline indium phosphide (InP) or the like TFTs are described. Such TFTs may provide the bulwark against threshold voltage shift in OLED or micro LED displays. Implementing embodiments described herein may enable the use of TFT backplanes that are cheaper to manufacture as compared to low temperature polycrystalline silicon (LTPS) TFT backplanes. It is also to be appreciated that a channel material of InP may have an improved material quality as compared to IGZO. As such, an InP TFT or InP-like TFT may be used as a backend transistor for CMOS devices, particularly since the InP channel may be grown at a relatively low processing temperature temperature (e.g., less than 450 degrees Celsius).

To provide further context, since amorphous Indium-Gallium-Zinc-Oxide (a-IGZO) was successfully employed in organic light-emitting diode (OLED) TV products in 2013, requirement of higher mobility and better stability has become more stringent as OLED TV technology moves toward higher resolution, higher frame rate, higher brightness and longer lifetime. Manufacturability of amorphous oxide TFT on Generation 8 glass or even bigger sizes of glass, which is a major advantage over low temperature poly-Si (LTPS) TFT, has accelerated to develop more stable and higher mobility oxide TFTs to apply to not only OLED TV but also other applications that LTPS TFT has previously dominated. The IGZO TFT performance stability requirement becomes more stringent in display applications with higher resolution, higher frame rate, higher brightness, and longer target product lifetime. Current-driving TFTs in an OLED pixel are often under the influence of positive gate-bias temperature stress (PBTS). Under the influence of PBTS, the threshold voltage (VT) shifts in the positive direction. The physical origin of PBTS instability has been classified largely by a combination of (1) trapping of electrons in the gate insulator and (2) change in defect states in the IGZO channel region.

In accordance with one or more embodiments described herein, devices, structures, and methods of manufacturing of InP or gallium phosphide (GaP), or the like, thin film transistors are described. In one embodiment, such InP or GaP materials are crystalline or polycrystalline providing the opportunity to have a defect density lower than the defect density typically associated with IGZO, leading to more reliable thin film transistors under prolonged usage.

As an exemplary comparison, the use of "crystalline" or "polycrystalline" InP channel material is used to fabricate TFTs having greater reliability than amorphous IGZO based TFTs. In an example, FIG. 1 illustrates cross-sectional views of (a) a thin film transistor (TFT) having an indium gallium zinc oxide (IGZO) channel material layer and (b) a thin film transistor (TFT) having a channel material layer including a crystalline Group III-P material, in accordance with an embodiment of the present disclosure.

Referring to the left-hand side of FIG. 1, an IGZO-based TFT structure 100 includes a substrate 102. An insulating layer 104 is on the substrate 102. A gate electrode 106 is on the insulating layer 104. A gate dielectric 108 is on the gate electrode 106 and extends past the gate electrode 106. An amorphous IGZO channel material layer 110 is on the gate dielectric 108. An inter-layer dielectric (ILD) layer 112 is over the amorphous IGZO channel material layer 110. Source or drain conductive contacts 114 are in openings in the ILD layer 112 and contact portions of the amorphous IGZO channel material layer 110 extending past the gate electrode 106.

Referring to the right-hand side of FIG. 1, an InP-based TFT structure 150, or the like, includes a substrate 152, such as a glass substrate of a backplane. An insulating layer 154, such as a buffer oxide material, is on the substrate 152. A gate electrode 156, such as a metal gate electrode, is on the insulating layer 154. A gate dielectric 158, such as a high-k dielectric, is on the gate electrode 156 and extends past the gate electrode 156. An InP, or similar, channel material layer 160 is on the gate dielectric 158. An inter-layer dielectric (ILD) layer 162 is over the channel material layer 160. Source or drain conductive contacts 164 are in openings in the ILD layer 162 and contact portions of the channel material layer 160 extending past the gate electrode 156.

Referring again to the right-hand side of FIG. 1, in accordance with an embodiment of the present disclosure, an integrated circuit structure 150 includes an insulator structure 154 above a substrate 152. A gate electrode 156 is on the insulator structure 154. A channel material layer 160 is over the gate electrode 156 and extends beyond a first side and a second side of the gate electrode 156. The channel material layer 160 includes a crystalline Group III-P material. A first conductive contact (left 114) is on a portion of the channel material layer 160 extending beyond the first side of the gate electrode 156. A second conductive contact (right 114) is on a portion of the channel material layer 160 extending beyond the second side of the gate electrode 156.

In an embodiment, the crystalline Group III-P material is a binary material selected from the group consisting of indium phosphide (InP) and gallium phosphide (GaP). In another embodiment, the crystalline Group III-P material is a ternary material selected from the group consisting of indium gallium phosphide (InGaP) and indium arsenic phosphide (InAsP). In an embodiment, the crystalline Group III-P material is single crystalline or polycrystalline. In an embodiment, the crystalline Group III-P material layer has a thickness between 5 nanometers and 30 nanometers. In an embodiment, the crystalline Group III-P material is doped N-type, e.g., to fabricate an N-channel device. In another embodiment, the crystalline Group III-P material is doped P-type, e.g., to fabricate a P-channel device.

In an embodiment, the integrated circuit structure 150 further includes a gate dielectric layer 158 between the gate electrode 156 and the channel material layer 160, as is depicted. In one such embodiment, the gate dielectric layer 158 includes a layer of a high-k dielectric material in direct contact with the channel material layer.

It is to be appreciated that InP-based TFTs are promising candidates for the backplane of flat panel displays because they may have various advantages over polycrystalline silicon (poly-Si), hydrogenated amorphous silicon (a-Si:H) TFTs, or IGZO TFTs: (1) crystalline InP (or c-InP) TFTs can be fabricated using a low temperature process (e.g., 400-450 degrees Celsius), (2) both n-channel and p-channel c-InP TFTs can be fabricated, allowing the implementation of well-developed CMOS-based circuits, (3) c-InP has a higher field effect mobility and a higher current on/off ratio, (4) c-InP TFTs do not have high bulk trap densities such as those in the forbidden gap in IGZO-channel transistors and, as such, may have higher stability under a constant voltage or current stress than a-Si TFTs and IGZO TFTs, (5) approaches for manufacturing crystalline InP channels does require the expensive laser crystallization needed to fabricate low-temperature polysilicon TFTs, (6) the bandgap of c-InP is 1.35 eV, which is higher than that of poly-Si (approximately 1.12 eV) and, therefore, a lower off-state current may be achieved.

Crystalline InP may be deposited on $SiO_2$ (or other gate dielectrics) using a thin-film vapor-liquid-solid (TF-VLS) approach or other suitable deposition technique. As an exemplary process flow for fabricating an InP TFT, or the like, FIGS. 2A-2H illustrate cross-sectional views representing various operations in a process of fabricating a thin film transistor (TFT), in accordance with an embodiment of the present disclosure.

Referring to FIG. 2A, a process flow for fabricating an InP TFT backplane includes providing a substrate 202, such as a glass substrate of a backplane. An insulating layer 204, such as a buffer oxide material, is deposited on the substrate 202, as is depicted in FIG. 2B. Referring to FIG. 2C, a gate electrode 206, such as a metal gate electrode, is formed on the insulating layer 204, e.g., by a blanket deposition and patterning process. A gate dielectric 208, such as a high-k dielectric, is deposited on the gate electrode 206 and extends past the gate electrode 206, as is depicted in FIG. 2D.

Figure 2E:
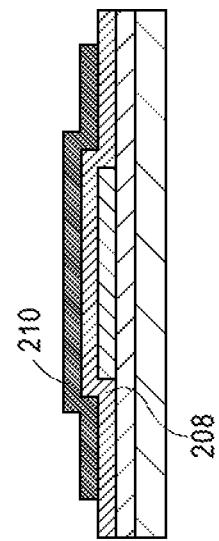

Referring to FIG. 2E, an InP or GaP, or similar, channel material layer 210 is formed on the gate dielectric 208. In one embodiment, the channel material layer 210 is patterned following a blanket deposition process. In an embodiment, the patterned channel material layer 210 extends beyond sides of the gate electrode 206, as is depicted.

In an embodiment, the channel material layer 210 is or includes an InP layer and is formed using a TF-VLS process as follows: (1) deposit indium (metal) and a porous capping layer (such as SiOx) on an oxide substrate (e.g., on a gate insulator of a bottom gate thin film transistor), (2) create "pixels" or "islands" of the stack using patterning and etching (e.g., the size of an island may be up to 2500 micrometer squared; for transistors with channel length of 10 microns and channel width of 20 microns, the size of the island should be (10+2)×(20+2) square micrometer, for example; if no islands are created, a polycrystalline InP film will result that will still have high electron mobility (e.g. >100 cm2/V-s) as has been demonstrated), and (3) heating the stack (e.g., at a temperature between 400-450 degrees Celsius) in an environment of $PH_3/H_2$ gas for 1-60 minutes. Unlike other growth techniques (e.g., epitaxial growth using MOVPE) which happens "vertically", the growth process for InP using a TF-VLS process starts at a nucleation site and first grows isotropically. However, once the InP reaches an SiOx capping layer, no vertical growth can occur, and the InP grows out laterally. In TF-VLS growth, it is understood that there is only one chemical reaction occurring: indium (liquid)+P (gas)→InP (solid). The reaction is thermodynamically driven as the concentration of P in the liquid indium is maintained sufficiently high that the Gibbs free energy of the reactants side of the reaction is higher than the InP products side of the reaction, driving toward the desired product. As temperature is changed, (1) the solubility of P in liquid indium is changed, and (2) the indium/P ratio in solid InP is changed. It is to be appreciated that a growth available P for the above reaction to occur.

Figure 2F:
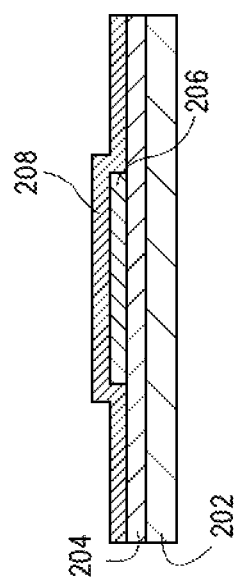
Figure 2G:
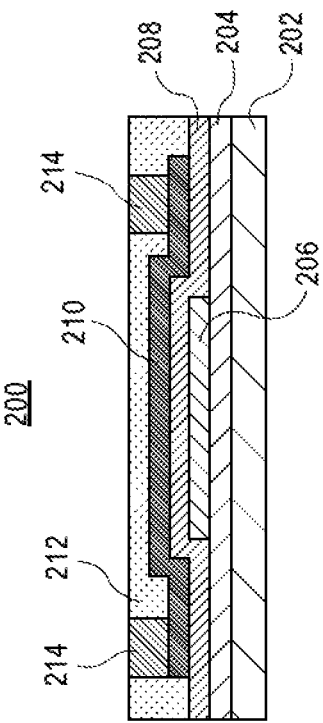
Figure 2H:
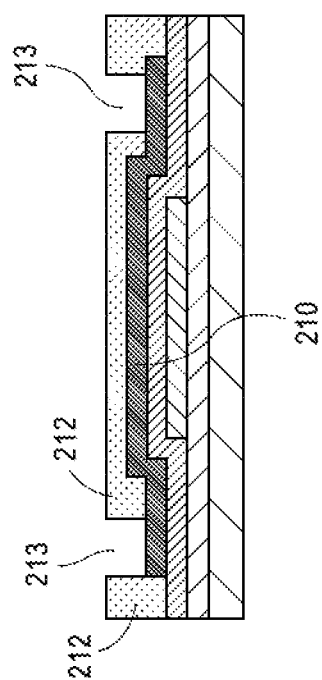

Referring to FIG. 2F, an inter-layer dielectric (ILD) layer 212 is formed over the channel material layer 210. Source or drain contact openings 213 are then formed in the ILD layer 212, as is depicted in FIG. 2G. Referring to FIG. 2H, source or drain conductive contacts 214 are formed in the openings 213 in the ILD layer 212. The source or drain conductive contacts 214 contact portions of the channel material layer 210 extending past the gate electrode 206. The resulting device 200 may be as described above for integrated circuit structure 150.

In another aspect, backend transistor applications are considered. It is to be appreciated that some integrated circuit (IC) designs can switch off current to a portion of an IC device, thereby reducing power consumption, e.g., standby power consumption. Such techniques are sometimes called power gating. Power gating can be performed, e.g., using power gating switches. Power gating switches are typically formed in a front end-of-line (FEOL) portion of the IC device. However, power gating switches formed in the FEOL occupy valuable substrate footprint, which results in added die size of the IC device and can increase the overall cost. Thus, there is a need for IC devices in which power gating switches are formed in a back end-of-the line (BEOL).

In accordance with one or more embodiments of the present disclosure, a BEOL transistor structure is disclosed. The transistor consumes a smaller footprint than state-of-the-art planar BEOL transistors for a given drive current output. In one embodiment, a BEOL transistor has an InP channel material layer fabricated at a temperature of less than approximately 450 degrees Celsius, e.g., using Thin-Film VLS growth.

Figure 3:
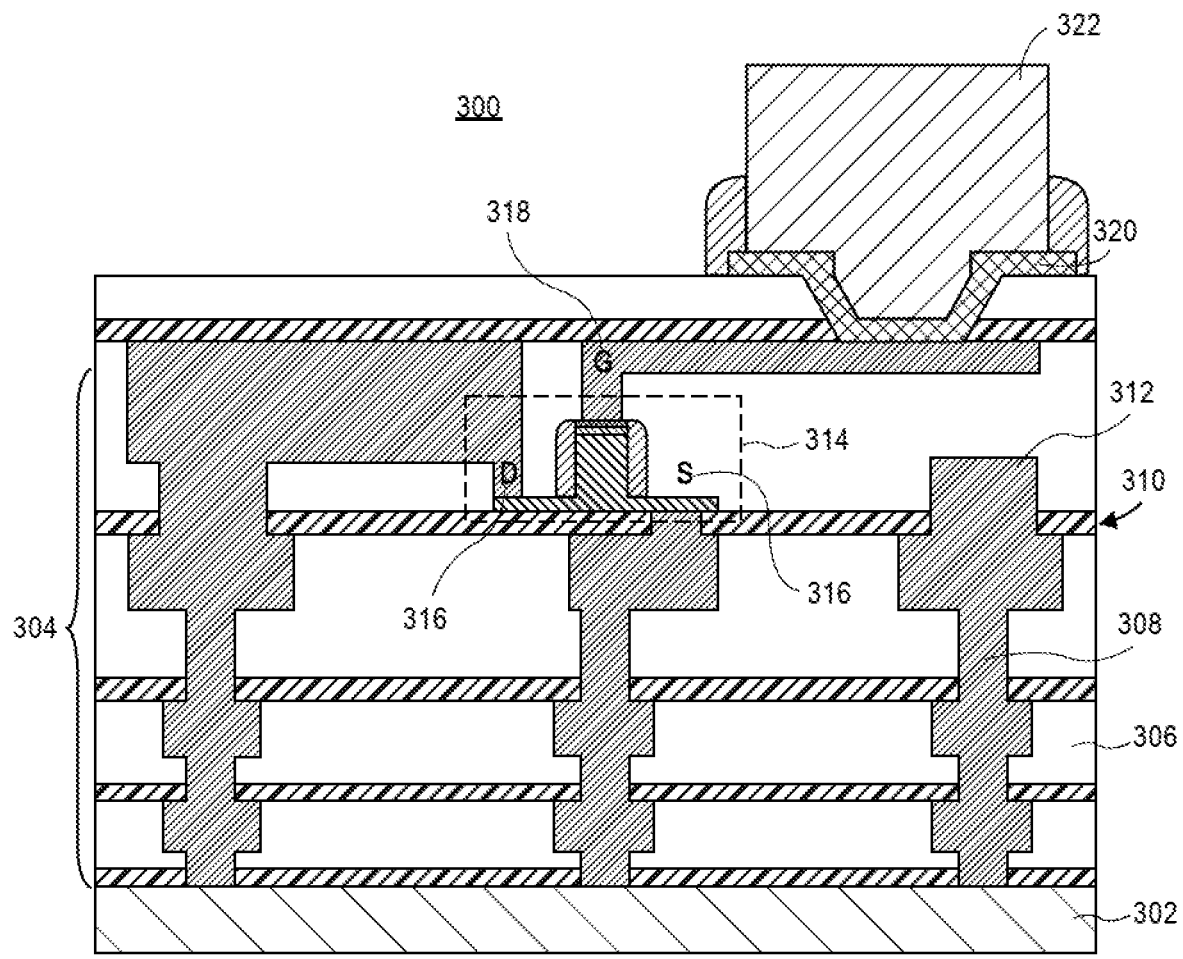
FIG. 3 illustrates a cross-sectional view of a back end of line (BEOL) structure including a thin film transistor (TFT), in accordance with an embodiment of the present disclosure.

As a possible example of a power gating transistor implemented in a pair of two adjacent metallization layers in a BEOL portion of an IC device, FIG. 3 illustrates a cross-sectional view of a back end of line (BEOL) structure including a thin film transistor (TFT), in accordance with an embodiment of the present disclosure. In a particular embodiment, the TFT is an InP thin film transistor (power gating transistor) formed in a BEOL structure.

Referring to FIG. 3, an integrated circuit structure 300 includes a FEOL portion 302, which is shown schematically as a rectangle, with a more detailed BEOL portion 304 shown thereon. The BEOL portion 304, as exemplified, includes a sequence of metallization layers M1, M2, M3 and M4, each of which may be separated by a passivation/etch stop/diffusion barrier layer or stack 310, and each of which may include interlayer dielectric structures 306, interconnect vias 308, and interconnect metal lines or structures 312, as described in greater detail below. It is to be appreciated that, typically, more than four metallization layers are present in an IC (e.g., as many as nine, or even more), but only four are shown for the sake of simplifying the drawing.

A backend transistor 314 is included in one or more of the metallization layers. The backend transistor 314 includes first and second source or drain structures 316, and a gate structure 318. The gate structure may include a gate electrode and gate dielectric.

Copper contact bumps 322 may contact the upper metallization layer M4 through contact pads 320. Each metallization layer includes an upper level including metal (preferably copper) lines 312 running in the plane of the layer, and a lower level including metal-filled via 308 interconnects for connecting the metal lines 312 to the underlying layer. The metal lines 312 and via interconnects 308 are embedded in a layer of interlayer dielectric 306 (e.g., $SiO_2$ or SiOC). The passivation/etch stop/diffusion barrier layer 310 may for example be layers of SiCN. In one implementation, the source (S), drain (D), and gate (G) terminals (316, 316, 318) of the backend transistor 314 are connected through interconnect metals to other portions of the circuit, as is shown in FIG. 3.

In another aspect, in accordance with one or more embodiments described herein, non-planar BEOL-compatible thin film transistors (TFTs) are fabricated by effectively increasing the transistor width (and hence the drive strength and performance) for a given projected area. A TFT fabricated using such an architecture may exhibit an increase in gate control, stability, and performance of thin film transistors. Applications of such systems may include, but are not limited to, back end (BEOL) logic, memory, or analog applications. Embodiments described herein may include non-planar structures that effectively increase transistor width (relative to a planar device) by integrating the devices in unique architectures.

Figure 4A:
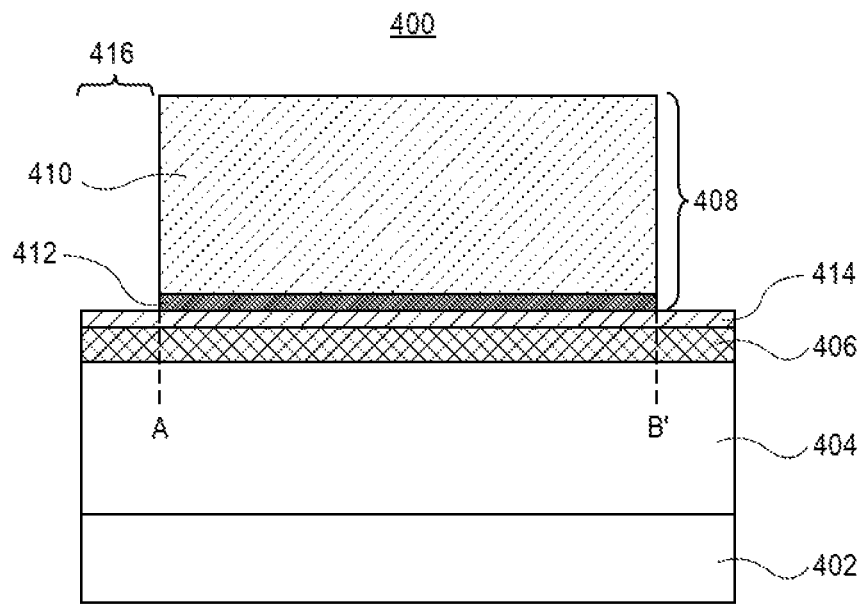
FIG. 4A illustrates a cross-sectional view taken along a gate "width" of a planar thin film integrated circuit structure, in accordance with an embodiment of the present disclosure.

To provide a benchmark, FIG. 4A illustrates a cross-sectional view taken along a gate "width" of a thin film integrated circuit structure, in accordance with an embodiment of the present disclosure.

Referring to FIG. 4A, a planar TFT 400 is formed above a substrate 402, e.g., on an insulating layer 404 above a substrate, as is shown. The planar TFT 400 includes a channel material layer 406, such as a channel material layer that is or includes a crystalline Group III-P material. A gate electrode 408 is formed on a gate dielectric layer 414 formed on the channel material layer 406. The gate electrode 408 may include a fill material 410 on a workfunction layer 412, as is depicted. The gate electrode 408 may expose regions 416 of the channel material layer 406 and the gate dielectric layer 414, as is depicted. Alternatively, the channel material layer 406 and the gate dielectric layer 414 have a same lateral dimension as the gate electrode 408. It is to be appreciated that source or drain regions are into and out of the page of the view of FIG. 4A.

The planar TFT 400 has an effective gate width that is the length of the planar channel material 406 between locations A and B', as depicted in FIG. 4A. The TFT 400 may be referred to herein as a planar BEOL field effect transistor (FET).

Figure 4B:
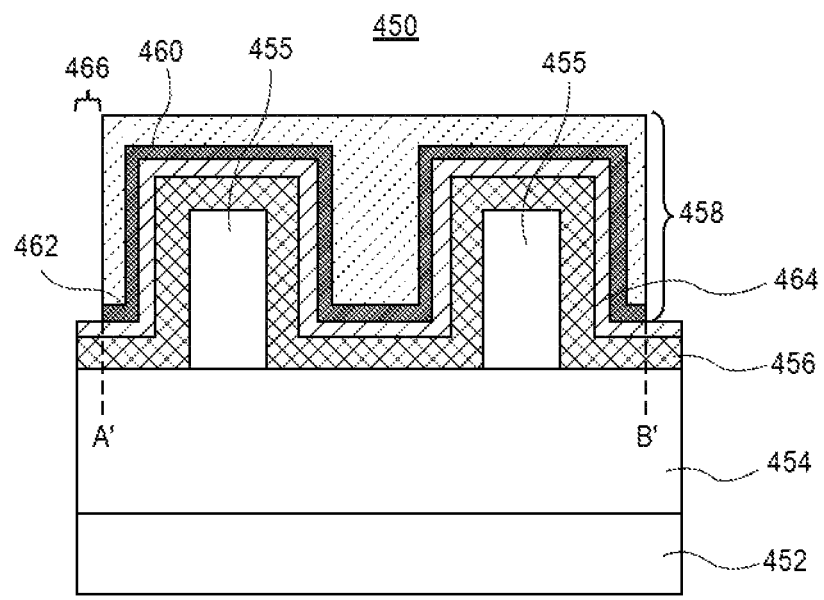
FIG. 4B illustrates a cross-sectional view taken along a gate "width" of a thin film integrated circuit structure having relatively increased width, in accordance with an embodiment of the present disclosure.

As a first example of a structure having relative increase in transistor width (e.g., relative to the structure of FIG. 4A), FIG. 4B illustrates a cross-sectional view taken along a gate "width" of a thin film integrated circuit structure having relatively increased width, in accordance with an embodiment of the present disclosure.

Referring to FIG. 4B, a non-planar TFT 450 is formed above a substrate 452, e.g., on an insulating layer 454 above a substrate, as is shown. A pair of dielectric fins 455 is on the insulating layer 454. The non-planar TFT 450 includes a channel material layer 456, such as a channel material layer that is or includes a crystalline Group III-P material. The channel material layer 456 is conformal with the pair of dielectric fins 455 and with exposed portions of the insulating layer 454 between the pair of dielectric fins 455. A gate electrode 458 is formed on a gate dielectric layer 464 formed on the channel material layer 456. The gate electrode 458 may include a fill material 460 on a workfunction layer 462, as is depicted. The gate electrode 458 may expose regions 466 of the channel material layer 456 and the gate dielectric layer 464, as is depicted. Alternatively, the channel material layer 456 and the gate dielectric layer 464 have a same lateral dimension as the gate electrode 458. It is to be appreciated that source or drain regions are into and out of the page of the view of FIG. 4B.

The non-planar TFT 450 has an effective gate width that is the length of the channel material layer 456 between locations A' and B', i.e., the full length including undulating portions over the tops and sidewalls of the dielectric fins 455, as is depicted in FIG. 4B. The TFT 450 may be referred to herein as a non-planar BEOL field effect transistor (FET). In comparison to FIG. 4A, the structure of FIG. 4B highlights the advantage of a non-planar architecture to increase effective gate width, referred to herein as a relatively increased width.

To highlight other aspects of a non-planar TFT topography, FIGS. 4C, 4D, and 4E illustrate angled and direct cross-sectional views of a thin film integrated circuit structure having relatively increased width, in accordance with an embodiment of the present disclosure. It is to be appreciated that one dielectric fin is illustrated in FIGS. 4C-4E for simplification. Embodiments may include a single device fabricated over one (FIG. 4C), two (FIG. 4B) or more such dielectric fins.

Referring to FIGS. 4C-4E, an integrated circuit structure 470 includes a dielectric fin 455 on an insulator layer 454 above a substrate 452. The dielectric fin 455 has a top and sidewalls. A channel material layer 456, such as a channel material layer that is or includes a crystalline Group III-P material, is on the top and sidewalls of the dielectric fin 455. A gate electrode 458 is over a first portion of the channel material layer 456 on the top and sidewalls of the dielectric fin 455. The gate electrode 458 has a first side opposite a second side. A first conductive contact (left 474) is adjacent the first side of the gate electrode 458, over a second portion of the channel material layer 456 on the top and sidewalls of the dielectric fin 455. A second conductive contact (right 474) is adjacent the second side of the gate electrode 458, over a third portion of the channel material layer 456 on the top and sidewalls of the dielectric fin 455.

In an embodiment, the integrated circuit structure 470 further includes a gate dielectric layer 464 between the gate electrode 458 and the first portion of the channel material layer 456 on the top and sidewalls of the dielectric fin 455, as is depicted in FIGS. 4C-4E. In an embodiment, the integrated circuit structure 470 further includes a first dielectric spacer (left 472) between the first conductive contact 474 and the first side of the gate electrode 458, the first dielectric spacer 472 over a fourth portion of the channel material layer 456 on the top and sidewalls of the dielectric fin 455. A second dielectric spacer (right 472) is between the second conductive contact 474 and the second side of the gate electrode 458, the second dielectric spacer 472 over a fifth portion of the channel material layer 456 on the top and sidewalls of the dielectric fin 455, as is depicted in FIGS. 4C and 4E. In one such embodiment, the gate dielectric layer 464 is further along the first and second dielectric spacers 472, as is also depicted in FIGS. 4C and 4E.

Referring collectively to FIGS. 4B-4E, in accordance with an embodiment of the present disclosure, an integrated circuit structure includes an insulator structure above a substrate. The insulator structure includes one or more fins, individual ones of the fins having a top and sidewalls. A channel material layer is on the top and sidewalls of the individual ones of the fins of the insulator structure, the channel material layer including a crystalline Group III-P material. A gate electrode is over a first portion of the channel material layer, the gate electrode having a first side opposite a second side. A first conductive contact is adjacent the first side of the gate electrode, the first conductive contact over a second portion of the channel material layer. A second conductive is contact adjacent the second side of the gate electrode, the second conductive contact over a third portion of the channel material layer.

In an embodiment, the crystalline Group III-P material is a binary material selected from the group consisting of indium phosphide (InP) and gallium phosphide (GaP). In another embodiment, the crystalline Group III-P material is a ternary material selected from the group consisting of indium gallium phosphide (InGaP) and indium arsenic phosphide (InAsP). In an embodiment, the crystalline Group III-P material is single crystalline or polycrystalline. In an embodiment, a crystalline Group III-P material layer has a thickness between 5 nanometers and 30 nanometers.

In an embodiment, the integrated circuit structure further includes a gate dielectric layer between the gate electrode and the first portion of the channel material layer. In one embodiment, the gate dielectric layer includes a layer of a high-k dielectric material directly on the channel material layer. In an embodiment, the integrated circuit structure further includes a first dielectric spacer between the first conductive contact and the first side of the gate electrode. The first dielectric spacer is over a fourth portion of the channel material layer. A second dielectric spacer is between the second conductive contact and the second side of the gate electrode. The second dielectric spacer is over a fifth portion of the channel material layer.

In an embodiment, the insulator structure 455 (such as fin or fins 455) is composed of a dielectric material such as, but not limited to, silicon dioxide, silicon oxy-nitride, silicon nitride, or carbon-doped silicon nitride. In an embodiment, the insulator structure 455 is composed of a low-k dielectric material. In an embodiment, dielectric fins described herein may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have dielectric fins spaced at a constant pitch and having a constant width. The pattern may be fabricated by a pitch halving or pitch quartering, or other pitch division, approach. In an embodiment, the dielectric fin or fins 455 each have squared-off (as shown) or rounder corners.

Figure 5A:
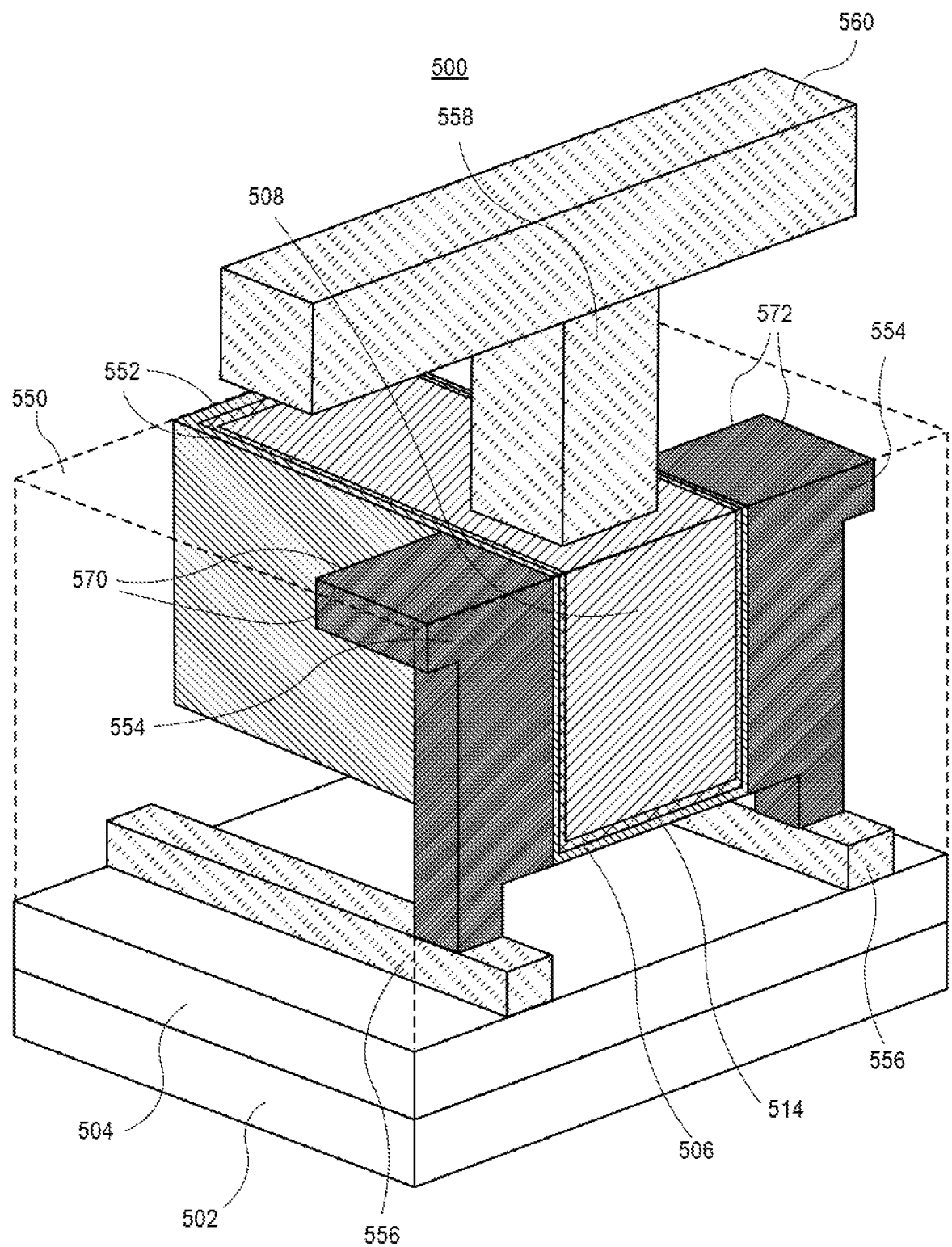
FIG. 5A illustrates an angled three-dimensional view of another thin film integrated circuit structure having relatively increased width, in accordance with another embodiment of the present disclosure.
Figure 5B:
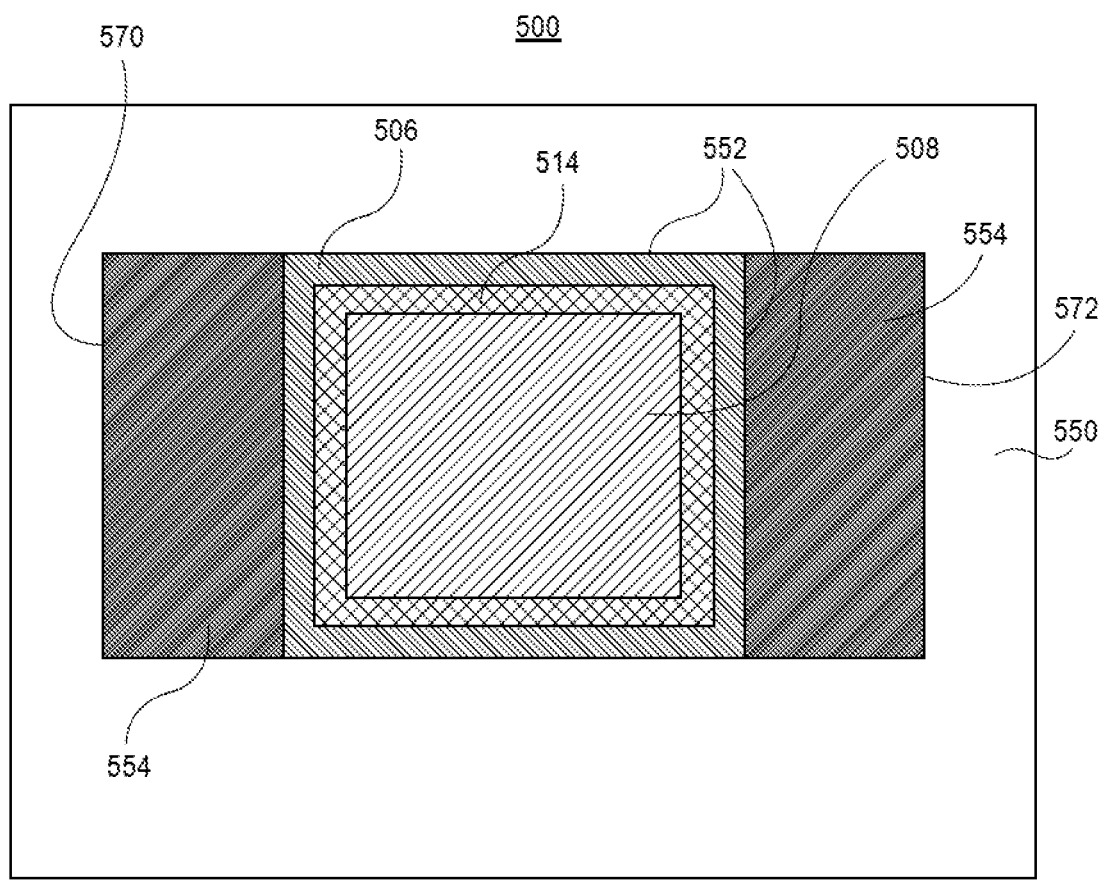
FIG. 5B illustrates a top-down view of a portion of the thin film integrated circuit structure of FIG. 5A, in accordance with another embodiment of the present disclosure.

As a second example of a structure having relative increase in transistor width, FIG. 5A illustrates an angled three-dimensional view of another thin film integrated circuit structure having relatively increased width, in accordance with another embodiment of the present disclosure. FIG. 5B illustrates a top-down view of a portion of the thin film integrated circuit structure of FIG. 5A.

Referring to FIGS. 5A and 5B, an integrated circuit structure 500 includes an insulator structure 550 above a substrate 502. The insulator structure 550 may be formed on an insulator layer 504, as is depicted. The insulator structure 550 has a first trench 552 therein, the first trench 552 having sidewalls and a bottom. A channel material layer 506, such as a channel material layer that is or includes a crystalline Group III-P material, is in the first trench 552 in the insulator structure 550. The channel material layer 506 is conformal with the sidewalls and bottom of the first trench 552. A gate dielectric layer 514 is on the channel material layer 506 in the first trench 552. The gate dielectric layer 514 is conformal with the channel material layer 506 conformal with the sidewalls and bottom of the first trench 552. A gate electrode 508 is on the gate dielectric layer 514 in the first trench 552. The gate electrode 508 has a first side opposite a second side and has an exposed top surface. A first conductive contact (left 554) is laterally adjacent the first side of the gate electrode 508. The first conductive contact (left 554) is on a first portion of the channel material layer 506 conformal with the sidewalls of the first trench 552. A second conductive contact (right 554) is laterally adjacent the second side of the gate electrode 508. The second conductive contact (right 554) is on a second portion of the channel material layer 506 conformal with the sidewalls of the first trench 552. It is to be appreciated that the conductive contacts 554 are shown only at the front portion of trench 552 for clarity of the drawing. In an embodiment, the conductive contacts 554 extend all the way, or substantially all the way along the trench 552 for maximized source or drain contact area and maintain a relatively small effective gate length.

In an embodiment, the insulator structure 550 is a single layer of ILD material, as is depicted. In another embodiment, the insulator structure 550 is a stack of alternating dielectric layers, such as described in association with FIGS. 7A-7H.

In an embodiment, a third conductive contact 558 is over and in contact with the exposed top surface of the gate electrode 508, as is depicted. In an embodiment, the first conductive contact (left 554) is in a second trench 570 in the insulator structure 550, and the second conductive contact (right 554) is in a third trench 572 in the insulator structure 550, as is depicted. In an embodiment, the third conductive contact 558 is coupled to a conductive line 560, which may be a word line, as is depicted. In an embodiment, the first and second conductive contacts 554 are coupled corresponding conductive lines 556, as is depicted.

Referring again to FIG. 5A, in an embodiment, a non-planar back-end FET architecture uses the vertical length (depth) of the trench 552 to increase effective width of the transistor. That is, the depth of the trench 552 is the Z of the TFT, where the effective width (Weff) is relatively increased by setting Z to the depth of the trench.

Figure 6:
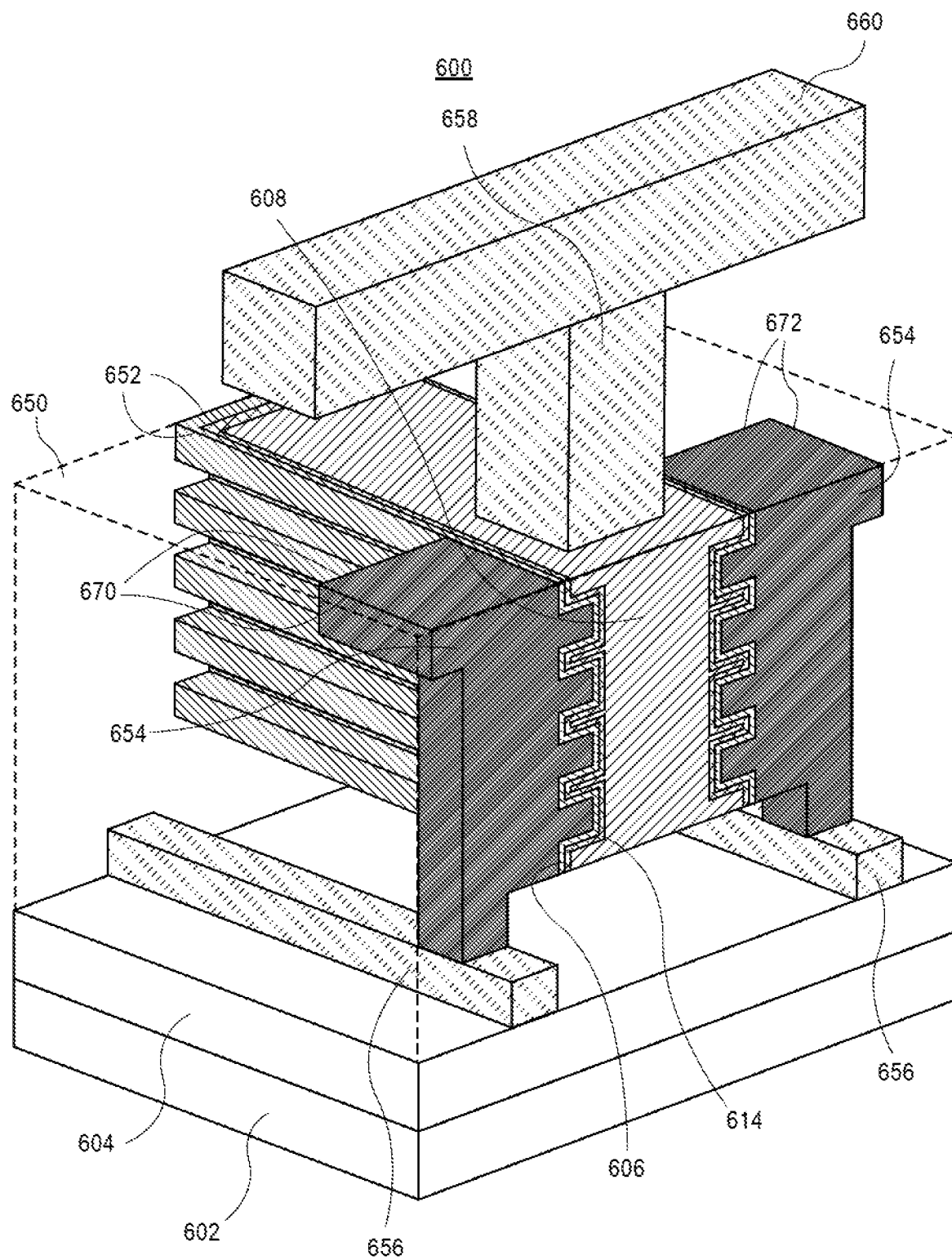
FIG. 6 illustrates an angled three-dimensional view of another thin film integrated circuit structure having relatively increased width, in accordance with another embodiment of the present disclosure.

As a third example of a structure having relative increase in transistor width, FIG. 6 illustrates an angled three-dimensional view of another thin film integrated circuit structure having relatively increased width, in accordance with another embodiment of the present disclosure.

Referring to FIG. 6, an integrated circuit structure 600 includes an insulator structure 650 above a substrate 602. The insulator structure 650 may be formed on an insulator layer 604, as is depicted. The insulator structure 650 has a first trench 652 therein, the first trench 652 having sidewalls and a bottom. The insulator structure 650 has a topography that varies along a plane normal with a global plane of the substrate 602. In one such embodiment, the insulator structure 650 has a corrugated topography that varies along a plane normal with a global plane of the substrate 602, as is depicted. In a specific such embodiment, the corrugated topography is within a single layer of ILD material, as is depicted. In another specific such embodiment, the corrugated topography is within an arrangement of alternating dielectric layers, such as described in association with FIGS. 7A-7H.

A channel material layer 606, such as a channel material layer that is or includes a crystalline Group III-P material, is in the first trench 652 in the insulator structure 650. The channel material layer 606 is conformal with the sidewalls and bottom of the first trench 652, i.e., conformal with the topography of the insulator structure 650. A gate dielectric layer 614 is on the channel material layer 606 in the first trench 652. The gate dielectric layer 614 is conformal with the channel material layer 606 conformal with the sidewalls and bottom of the first trench 652. A gate electrode 608 is on the gate dielectric layer 614 in the first trench 652. The gate electrode 608 has a first side opposite a second side and has an exposed top surface. A first conductive contact (left 654) is laterally adjacent the first side of the gate electrode 608. The first conductive contact (left 654) is on a first portion of the channel material layer 606 conformal with the sidewalls of the first trench 652. A second conductive contact (right 654) is laterally adjacent the second side of the gate electrode 608. The second conductive contact (right 654) is on a second portion of the channel material layer 606 conformal with the sidewalls of the first trench 652. In an embodiment, the conductive contacts 654 extend all the way, or substantially all the way along the trench 652 for maximized source or drain contact area and maintain a relatively small effective gate length.

In an embodiment, a third conductive contact 658 is over and in contact with the exposed top surface of the gate electrode 608, as is depicted. In an embodiment, the first conductive contact (left 654) is in a second trench 670 in the insulator structure 650, and the second conductive contact (right 654) is in a third trench 672 in the insulator structure 650, as is depicted. In an embodiment, the third conductive contact 658 is coupled to a conductive line 660, which may be a word line, as is depicted. In an embodiment, the first and second conductive contacts 654 are coupled corresponding conductive lines 656, as is depicted.

Referring again to FIG. 6, in an embodiment, a non-planar back-end FET architecture uses the vertical length (depth) of the trench 652, including the additional length provided by the corrugation, to increase effective width of the transistor. That is, the length of the corrugated trench 652 is the Z of the TFT, where the effective width (Weff) is relatively increased by setting Z to the depth or length along the corrugated trench 652.

Referring collectively, to FIGS. 5A and 6, in accordance with an embodiment of the present disclosure, an integrated circuit structure includes an insulator structure above a substrate. The insulator structure has a trench therein, the trench having sidewalls and a bottom. A channel material layer is in the trench in the insulator structure, the channel material layer conformal with the sidewalls and bottom of the trench. A gate dielectric layer is on the channel material layer in the trench, the gate dielectric layer conformal with the channel material layer. A gate electrode is on the gate dielectric layer in the trench, the gate electrode having a first side opposite a second side and having an exposed top surface. A first conductive contact is laterally adjacent the first side of the gate electrode, the first conductive contact on a first portion of the channel material layer. A second conductive contact is laterally adjacent the second side of the gate electrode, the second conductive contact on a second portion of the channel material layer.

In an embodiment, the integrated circuit structure further includes a third conductive contact over and in contact with the exposed top surface of the gate electrode. In an embodiment, the first conductive contact is in a second trench in the insulator structure, and the second conductive contact is in a third trench in the insulator structure.

In an embodiment, the crystalline Group III-P material is a binary material selected from the group consisting of indium phosphide (InP) and gallium phosphide (GaP). In another embodiment, the crystalline Group III-P material is a ternary material selected from the group consisting of indium gallium phosphide (InGaP) and indium arsenic phosphide (InAsP). In an embodiment, the crystalline Group III-P material is single crystalline or polycrystalline. In an embodiment, a crystalline Group III-P material layer has a thickness between 5 nanometers and 30 nanometers. In an embodiment, the gate dielectric layer includes a layer of a high-k dielectric material directly on the channel material layer.

In accordance with an embodiment of the present disclosure, the above TFT non-planar architectures 450, 470, 500 and 600 provide for higher effective widths for a transistor for a scaled projected area. In an embodiment, the drive strength and performance of such transistors are improved over state-of-the-art planar BEOL transistors.

As an exemplary processing scheme, FIGS. 7A-7H illustrate cross-sectional and plan views of various stages in a method of fabricating a thin film integrated circuit structure having relatively increased width, in accordance with an embodiment of the present disclosure.

Figure 7A:
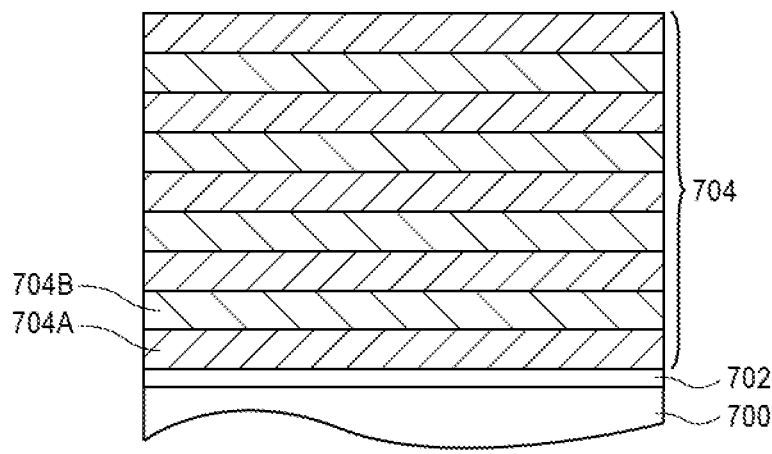
FIGS. 7A-7H illustrate cross-sectional and plan views of various stages in a method of fabricating a thin film integrated circuit structure having relatively increased width, in accordance with an embodiment of the present disclosure.

Referring to FIG. 7A, a stack 704 of dielectric layers is formed above a substrate 700 and, possibly, on an insulating layer 702 formed on or above the substrate 700. The stack 704 of dielectric layers includes alternating dielectric layers 704A and 704B of differing composition. In one embodiment, the stack 704 of dielectric layers is a stack of alternating silicon dioxide and silicon nitride layers.

Figure 7B:
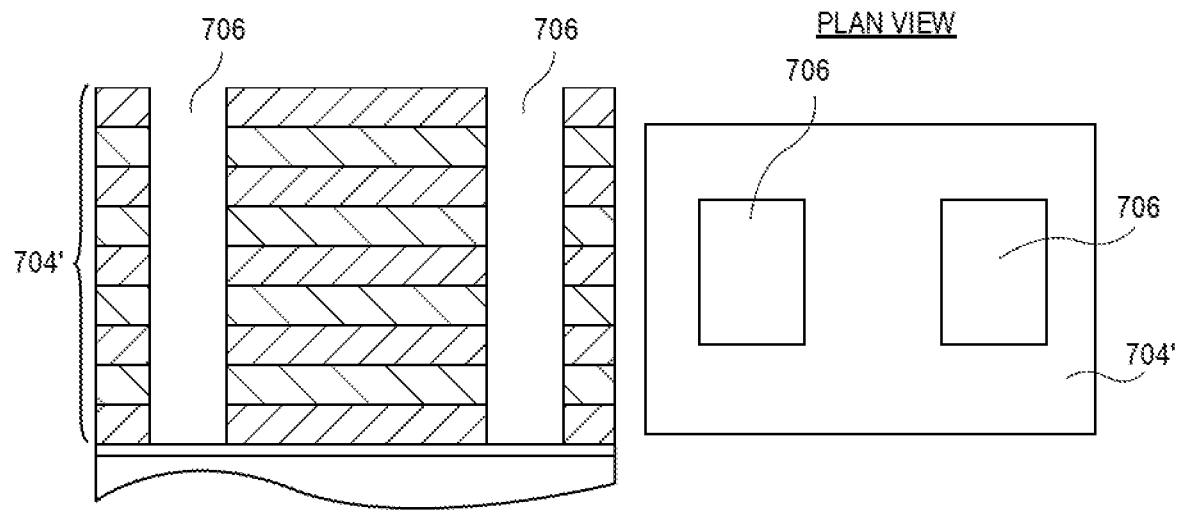

Referring to FIG. 7B, openings 706 are formed in the stack 704 of dielectric layers to form a once-patterned stack 704' of dielectric layers. In one embodiment, the structure of FIG. 7B is used without the process described below in association with FIG. 7C in order to arrive at a structure such as TFT 500.

Figure 7C:
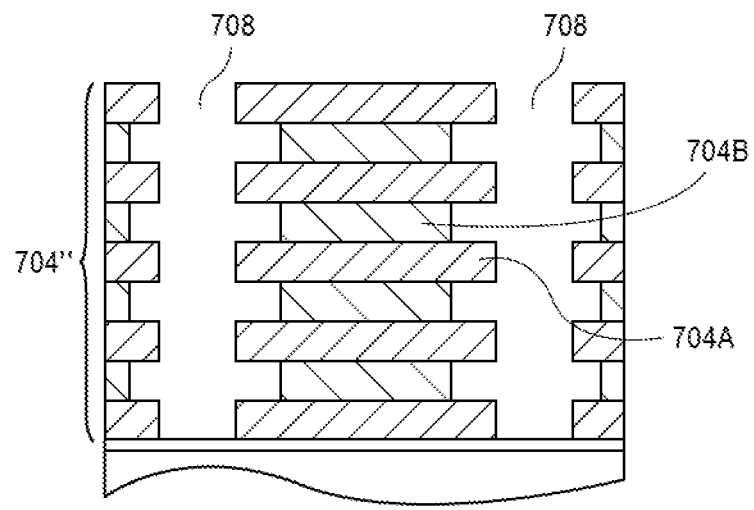

Referring to FIG. 7C, corrugation is achieved to form corrugated openings 708 by exposing the structure of FIG. 7B to an etch process that recesses layers 704B selective to layers 704A. The selective etching process provides twice-patterned stack 704" of dielectric layers. The twice-patterned stack 704" of dielectric layers may be used in order to arrive at a structure such as TFT 600.

Figure 7D:
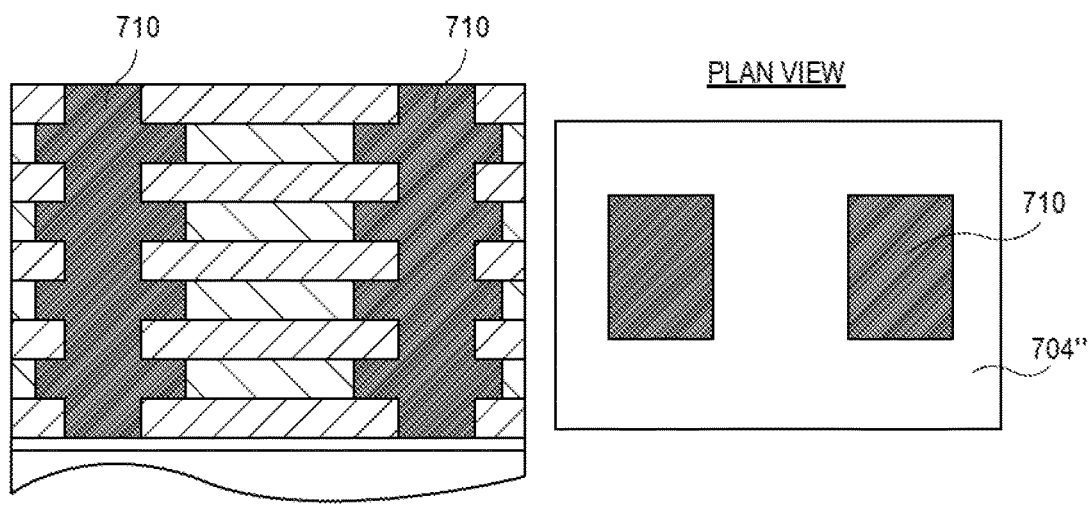

Referring to FIG. 7D, conductive contacts 710, such as source or drain contacts, are formed in the openings 708 of the structure of FIG. 7C. Conductive contacts may be formed, e.g., by a deposition or growth process.

Figure 7E:
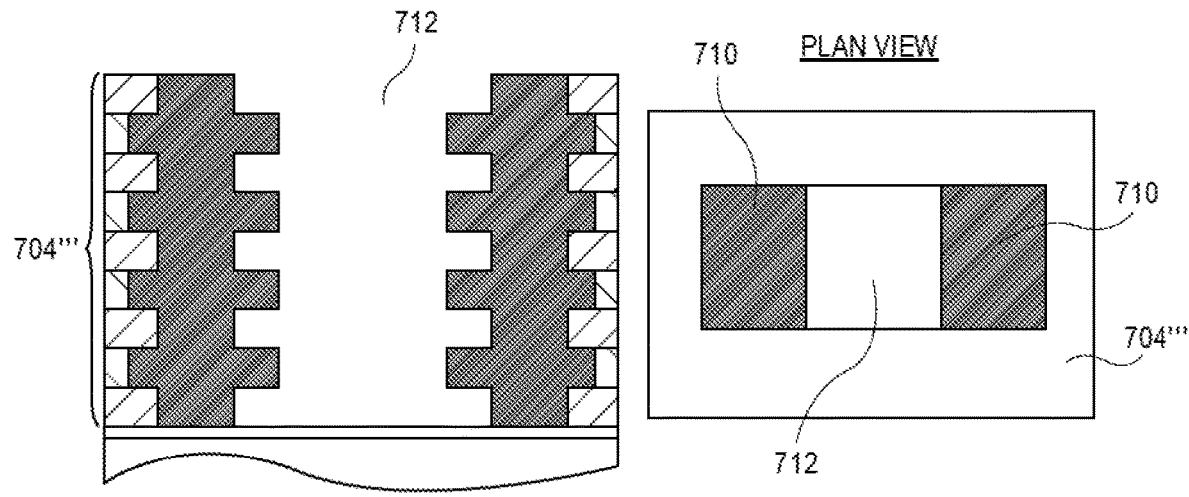

Referring to FIG. 7E, an opening 712 is formed between the conductive contacts 710 to form thrice-patterned stack 704''' of dielectric layers. The opening 712 exposes a corrugated surface of the conductive contacts 710.

Figure 7F:
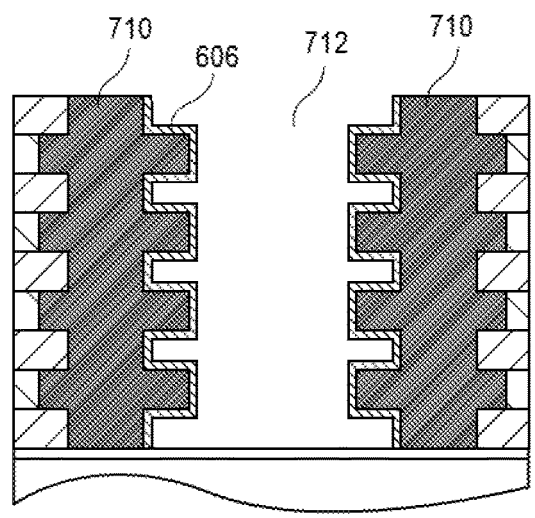

Referring to FIG. 7F, a channel material layer 606, such as a channel material layer that is or includes a crystalline Group III-P material, is formed in opening 712 along the exposed surfaces of the conductive contacts 710. In an embodiment, the channel material layer 606 is formed conformal with the corrugated surface of the conductive contacts 710, as is depicted.

Figure 7G:
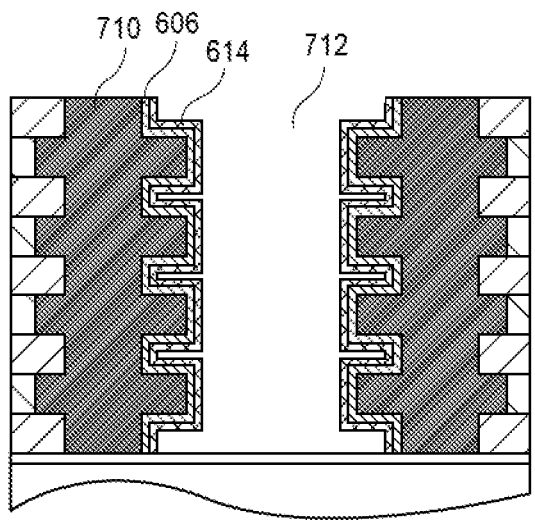

Referring to FIG. 7G, a gate dielectric layer 614 is formed in opening 712. The gate dielectric layer is on and conformal with the channel material layer 606.

Figure 7H:
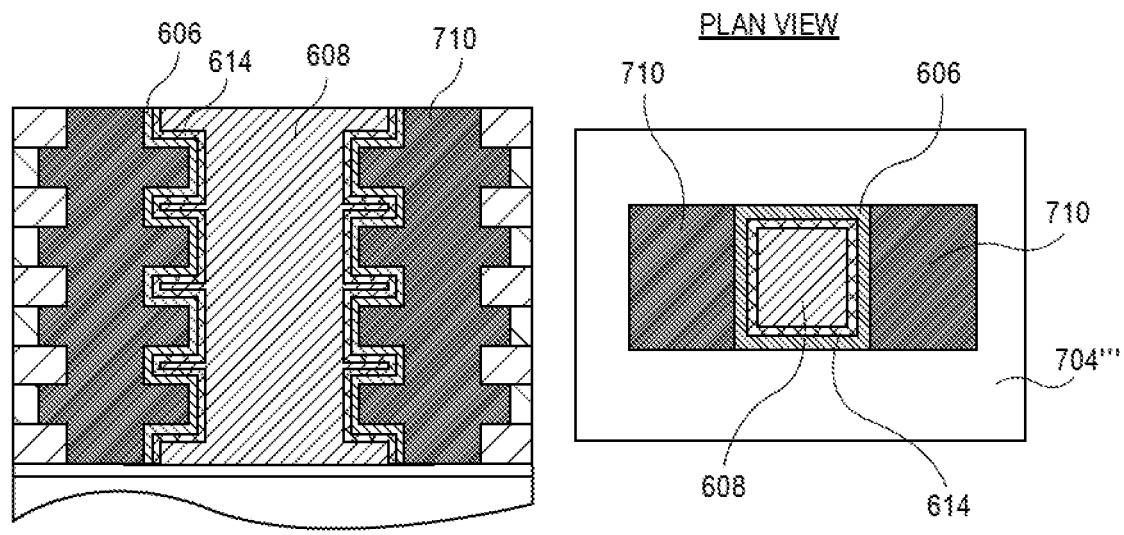

Referring to FIG. 7H, a gate electrode 608 is formed within opening 712. The gate electrode is on and conformal with the gate dielectric layer 614. The structure of FIG. 7G may be included as a portion of the TFT 600 described in association with FIG. 6.

It is to be appreciated that the layers and materials described in association with embodiments herein are typically formed on or above an underlying semiconductor substrate, e.g., as FEOL layer(s). In other embodiments, the layers and materials described in association with embodiments herein are typically formed on or above underlying device layer(s) of an integrated circuit, e.g., as BEOL layer(s) above an underlying semiconductor substrate. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated on underlying lower level back end of line (BEOL) interconnect layers.

In the case that an insulator layer, such as layer 454, 504, 604 or 702 is optionally used, the insulator layer may be composed of a material suitable to ultimately electrically isolate, or contribute to the isolation of, portions of a gate structure from an underlying bulk substrate or interconnect layer. For example, in one embodiment, the insulator layer is composed of a dielectric material such as, but not limited to, silicon dioxide, silicon oxy-nitride, silicon nitride, or carbon-doped silicon nitride. In a particular embodiment, the insulator layer is a low-k dielectric layer of an underlying BEOL layer.

In an embodiment, a gate electrode described herein includes at least one P-type work function metal or N-type work function metal, depending on whether the integrated circuit device is to be included in a P-type transistor or an N-type transistor. For a P-type transistors, metals that may be used for the gate electrode may include, but are not limited to, ruthenium, palladium, platinum, cobalt, nickel, and conductive metal oxides (e.g., ruthenium oxide). For an N-type transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode includes a stack of two or more metal layers, where one or more metal layers are work function metal layers and at least one metal layer is a fill metal layer. Further metal layers may be included for other purposes, such as to act as a barrier layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In an embodiment, a gate dielectric layer as described herein is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In some implementations, the gate dielectric may consist of a "U"-shaped structure that includes a bottom portion substantially parallel to the surface of the substrate and two sidewall portions that are substantially perpendicular to the top surface of the substrate, as is depicted in FIGS. 4C and 4E.

In an embodiment, dielectric spacers as described herein are formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used. For example, two pairs, three pairs, or four pairs of sidewall spacers may be formed on opposing sides of a gate electrode.

In an embodiment, conductive contacts as described herein act as contacts to source or drain regions of a TFT, or act directly as source or drain regions of the TFT. The conductive contacts may be spaced apart by a distance that is the gate length of the transistor. In an embodiment, conductive contacts 558 or 658 directly contact a gate electrode. In some embodiments, the gate length is between 7 and 30 nanometers. In an embodiment, conductive contacts as described herein include one or more layers of metal and/or metal alloys. In a particular embodiment, the conductive contacts are composed of aluminum or an aluminum-containing alloy.

In an embodiment, interconnect lines (and, possibly, underlying via structures), such as interconnect lines 312, 556, 560, 656 or 660, described herein are composed of one or more metal or metal-containing conductive structures. The conductive interconnect lines are also sometimes referred to in the art as traces, wires, lines, metal, interconnect lines or simply interconnects. In a particular embodiment, each of the interconnect lines includes a barrier layer and a conductive fill material. In an embodiment, the barrier layer is composed of a metal nitride material, such as tantalum nitride or titanium nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

Interconnect lines described herein may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines spaced at a constant pitch and having a constant width. The pattern may be fabricated by a pitch halving or pitch quartering, or other pitch division, approach.

In an embodiment, ILD materials described herein, such as ILD materials 250 or 350, are composed of or include a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In one aspect, a gate electrode and gate dielectric layer as described herein may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structures described herein. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed. The anneal is performed prior to formation of the permanent contacts.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, one or more embodiments described herein are directed to devices and architectures for micro LED displays. To provide context, displays based on inorganic micro LEDs (μLEDs) have attracted increasing attention for applications in emerging portable electronics and wearable computers such as head-mounted displays and wristwatches. Micro LEDs are typically first manufactured on Sapphire or silicon wafers (for example) and then transferred onto a display backplane glass substrate where on which active matrix thin-film transistors have been manufactured.

Micro LED displays promise 3×-5× less power compared to organic LED (OLED) displays. The difference would result in a savings in battery life in mobile devices (e.g., notebook and converged mobility) and can enhance user experience. In an embodiment, micro LED displays described herein consume two-fold less power compared to organic LED (OLED) displays. Such a reduction in power consumption may provide an additional approximately 8 hours of battery life. Such a platform may even outperform platforms based on low power consumption central processing units (CPUs). Embodiments described herein may be associated with one or more advantages such as, but not limited to, high manufacturing yield, high manufacturing throughput (display per hour), and applicability for displays with a diagonal dimension ranging from 2 inches to 15.6 inches.

In an embodiment, an indium phosphide (InP) thin film transistor (TFT) or InP-type TFT backplane for digital driving of micro LED displays is described.

To provide context, low temperature polysilicon (LTPS) backplanes are typically used in OLED displays, including those that are manufactured on flexible substrates. However, LTPS backplanes are expensive, in part, due to the large number of masks. Additionally, LTPS backplanes do not, at present, scale beyond sixth generation (1500×1850 cm) factories, thereby limiting cost reduction opportunities via scalability to larger backplanes which scale to tenth generation (2940×3320 cm) display factories.

In accordance with one or more embodiments of the present disclosure, as an alternative to an LTPS backplane, an InP TFT or InP-type TFT backplane is used. In an embodiment, pixel circuits based on N-channel InP TFTs are used provide a bulwark against threshold voltage shift in a micro LED or micro OLED displays. The use of such N-channel InP TFTs enables the use of InP TFT or InP-type TFT backplanes that are cheaper compared to LTPS TFT backplanes. An exemplary InP-TFT pixel structure that may be included in an LED display is described below in association with FIG. 9.

In an embodiment, advantages of implementing one or more embodiments described herein may include, but need not be limited to, one or more of (1) low manufacturing cost, (2) reliable displays, and/or (3) digital driving which provides low power consumption for micro LEDs. It is to be appreciated that demand for low power in consumer electronic devices has increased dramatically in the past ten years due to limited battery lifespan. One of the components with the highest percentage of total energy consumption, and therefore a suitable candidate for improvement, is the display. The developments of low power displays are becoming a high priority for the consumer electronics industry. Micro LED (μLED) display is a type of emissive display technology that uses a matrix of individually-switched self-illuminating inorganic diodes that can be controlled and lit without a master backlight. Inorganic μLEDs have a number of potential advantages over organic LEDs (OLEDs) for display applications including high brightness, longer lifecycle, and imperviousness to image sticking and burn in. Typically, in μLED displays, a desired color and luminance value are created from various combinations of three colors of light emitting elements (red, green and blue).

Figure 8:
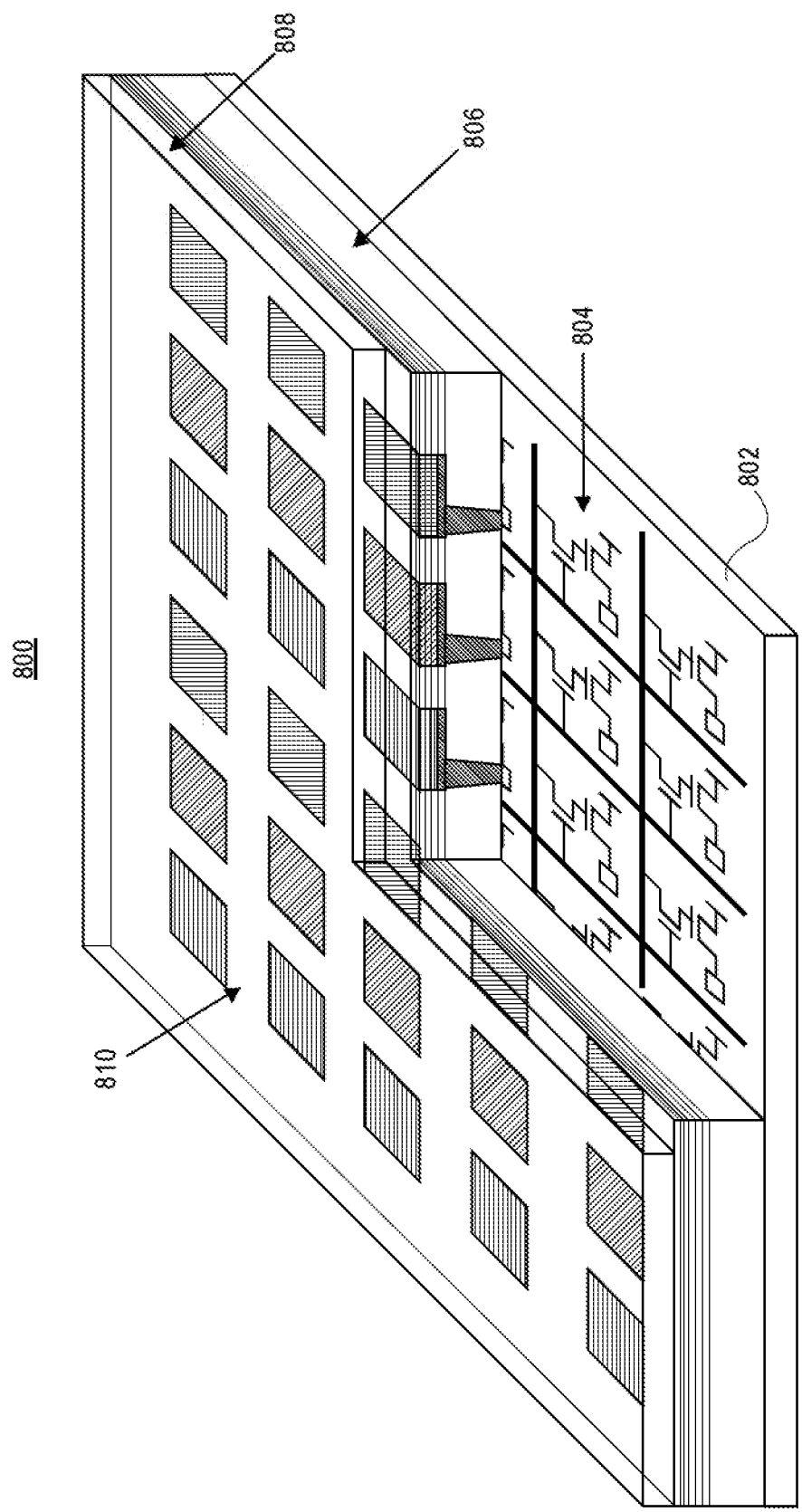
FIG. 8 illustrates a schematic of micro LED display architecture, in accordance with an embodiment of the present disclosure.

As an exemplary display architecture, FIG. 8 illustrates a schematic of micro LED or OLED display architecture, in accordance with an embodiment of the present disclosure. Referring to FIG. 8, a micro LED or OLED display 800 includes a backplane 802 having pixel circuits 804 thereon. An insulator 806 is over the pixel circuits 804. Micro LED layers 808 are included over the insulator 806. A transparent electrode 810 is over the micro LED layers 808. In one embodiment, pixel circuits 804 are described herein that are compatible with InP TFTs and InP-type TFTs.

Figure 9:
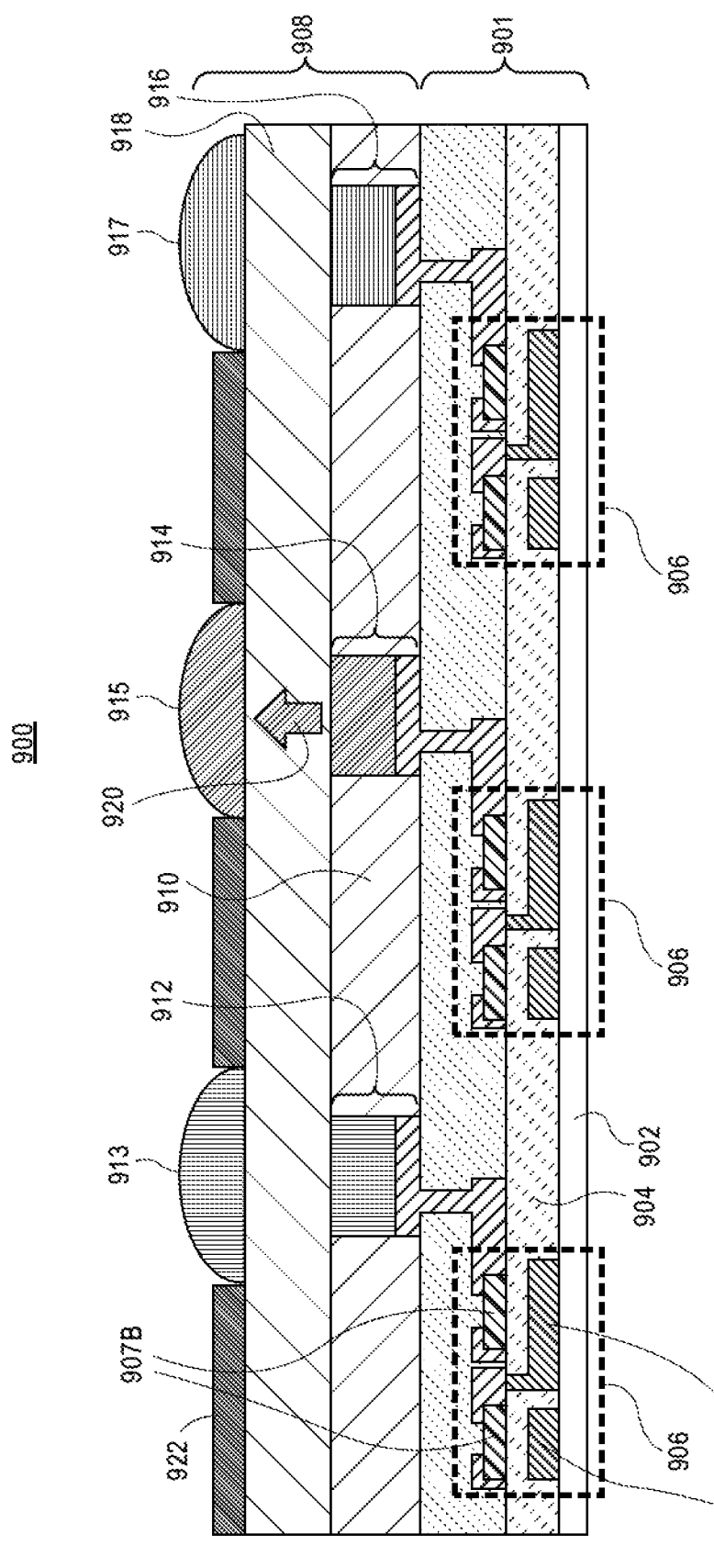
FIG. 9 illustrates a cross-sectional view of a pixel structure in accordance with an embodiment of the present disclosure.

As an exemplary pixel architecture, FIG. 9 illustrates a cross-sectional view of a pixel structure in accordance with an embodiment of the present disclosure.

Referring to FIG. 9, a pixel structure 900 includes a backplane 901. The backplane 901 includes a glass substrate 902 having an insulating layer 904 thereon. Pixel thin film transistor (TFT) circuits 906 are included in and on the insulating layer 904. Each of the pixel TFT circuits 906 includes gate electrodes 907A, such as metal gate electrodes, and channels 907B. A portion of the insulating layer 904 may act as a gate dielectric for each of the pixel TFT circuits 906. In an embodiment, each of the pixel thin film transistor circuits 906 is to drive at least one micro light emitting diode device.

In an embodiment, the channel material layer of the channels 907B is or includes a crystalline Group III-P material. In one embodiment, the crystalline Group III-P material is a binary material selected from the group consisting of indium phosphide (InP) and gallium phosphide (GaP). In another embodiment, the crystalline Group III-P material is a ternary material selected from the group consisting of indium gallium phosphide (InGaP) and indium arsenic phosphide (InAsP).

In accordance with one or more embodiments described herein, a microlens is implemented on top of a corresponding micro LED subsequent to transferring the micro LED from a donor wafer to a "standard" backplane. The microlens may assist to provide improved light extraction and control of a viewing angle. In an embodiment, such a microlens is fabricated using thermal reflow of photoresist, self-assembling of microspheres as microlenses, or ink-jet processing.

Referring again to FIG. 9, the pixel structure 900 includes a front plane 908 on the backplane 901. The front plane 908 includes LEDs in a dielectric layer 910, such as a carbon-doped oxide layer. In an exemplary embodiment, three micro LEDs 912, 914 and 916 are included. In a particular embodiment, micro LED 912 is a red micro LED, micro LED 914 is a green micro LED, and micro LED 916 is a blue micro LED. It is to be appreciated that other arrangements may be used, including variation in number and/or colors of micro LEDs included.

Referring again to FIG. 9, the front plane 908 includes a transparent conducting oxide layer 918 as a cathode of the pixel structure 900. A mask layer 922, such as a layer of $CrO_2$, is on the conducting oxide layer 918. Microlenses, such as microlenses 913, 915 and 917 (associated with micro LEDs 912, 914 and 916, respectively), are in openings in the mask layer 922 over an associated micro LED. In an embodiment, the arrangement provides for a collimated radiation pattern 920.

Embodiments described herein may be based only on the back plane 901 described above. Embodiments described herein may be based only on the front plane 908 described above. Embodiments described herein may be based on a front plane that does not include microlenses.

In an embodiment, an LED pixel structure 900 with integrated microlenses on each micro LED can (1) enhance extraction efficiency, and (2) tune the viewing angle per each display application. Since the radiation pattern from a nanowire LED is almost collimated, the image and color quality may be readily preserved.

In an embodiment, gate electrode 907A includes at least one P-type work function metal or N-type work function metal. For a P-type transistors, metals that may be used for the gate electrode 907A may include, but are not limited to, ruthenium, palladium, platinum, cobalt, nickel, and conductive metal oxides (e.g., ruthenium oxide). For an N-type transistor, metals that may be used for the gate electrode 907A include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

Advantages of implementing embodiments described herein may include, but need not be limited to, providing a path to low manufacturing cost, which is accomplished by transferring the red-green-blue micro LED pixels in one pass from silicon wafer to a "standard" display backplane. Improved light extraction may be realized with the use of microlenses. A significant reduction in reflectivity may be achieved to provide enhanced transmission, which serves to assist with light extraction from the micro devices. A tunable radiation pattern may be accomplished by depositing micro lenses on red, green, and blue micro LEDs after transferring to a backplane and depositing the transparent conducting electrode (e.g., indium tin oxide (ITO)) to form the common cathode for all micro LEDs.

Embodiments described herein may be implemented to enable large scale µLED display manufacturing that brings together three major separate technologies and supply chain bricks: (1) micro LED manufacturing, (2) display manufacturing, and (3) transfer technology tool manufacturing. In a typical display, each pixel is constituted of Red, Green and Blue (RGB) subpixels controlled independently by a matrix of transistors. The idea behind µLED displays is to use individual, small LED chips as the sub-pixel. Unlike OLEDs, inorganic LED require high processing temperatures (e.g., greater than 1000° C.) and cannot be "grown" and patterned directly on top of the transistor matrix. In most cases, the micro LED chips are therefore manufactured separately then positioned and connected to the transistor matrix via a pick and place process. Many companies and research organizations are currently working on µLED displays. However, volume production at costs compatible with the applications still face multiple engineering and manufacturing challenges. Such challenges include: LED epitaxy quality and homogeneity, efficiency of very small µLEDs, sidewall effects, massively parallel chip transfer technologies (e.g. pick and place) with position accuracy and high throughput, cost, handling of small die, etc., interconnects, color conversion, defect management, supply chain, and cost of production.

It is to be appreciated that due to the inorganic nature of the emitting materials of micro LEDs versus OLEDs, the efficiency and narrow emission bands of µLEDs also offer the prospect of significantly improved performance in terms of: energy consumption, color gamut, brightness, contrast (High Dynamic Range), long lifetime and environmental stability (not sensitive to air, moisture), and compatibility with flexible backplane technologies to enable curved or flexible displays. In addition, µLEDs can deliver extremely high pixel density (up to 5000 PPI) which, along with very high brightness, make them ideal for applications such as Augmented Reality (AR) or Head Up Display projectors.

In accordance with an embodiment of the present disclosure, for a display structure and backplane, the size of microlens is approximately the same as the size of the subpixel, e.g., as is shown in FIG. 9. In one embodiment, the RGB pixels are built directly upon the backplane that includes the transistor and capacitors to drive each individual subpixel. A micro LED is current driven and can use standard TFT LTPS or metal-oxide based backplane manufactured for the OLED industry on large dimension glass or flexible polymer substrates.

Figure 10:
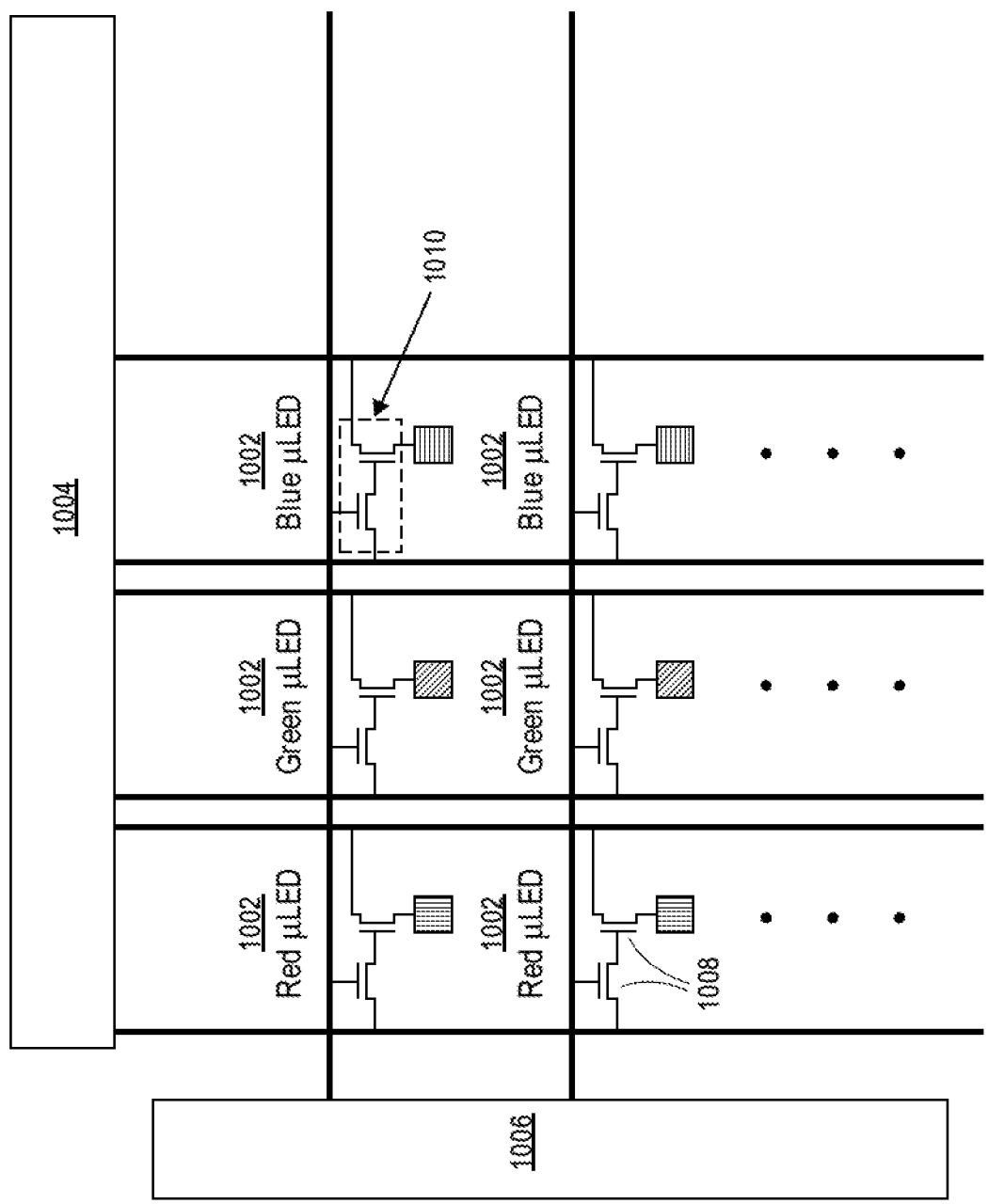
FIG. 10 is a schematic illustration of a display architecture, in accordance with an embodiment of the present disclosure.

FIG. 10 is a schematic illustration of a display architecture, in accordance with an embodiment of the present disclosure. Referring to FIG. 10, micro LEDs 1002 are arranged in a matrix. The micro LEDs are driven through "Data Driver" 1004 and "Scan Driver" 1006 chips. Thin film transistors 1008 are used to make "pixel driver circuits" 1010 for each micro LED. In an embodiment, the micro LEDs are fabricated on a silicon wafer then transferred to a glass substrate called "backplane" where the "pixel driver circuits" 1010 have been fabricated using thin film transistors. In an embodiment, each of the thin film transistors 1008 has a channel material layer including a crystalline Group III-P material, as described herein.

Figure 11:
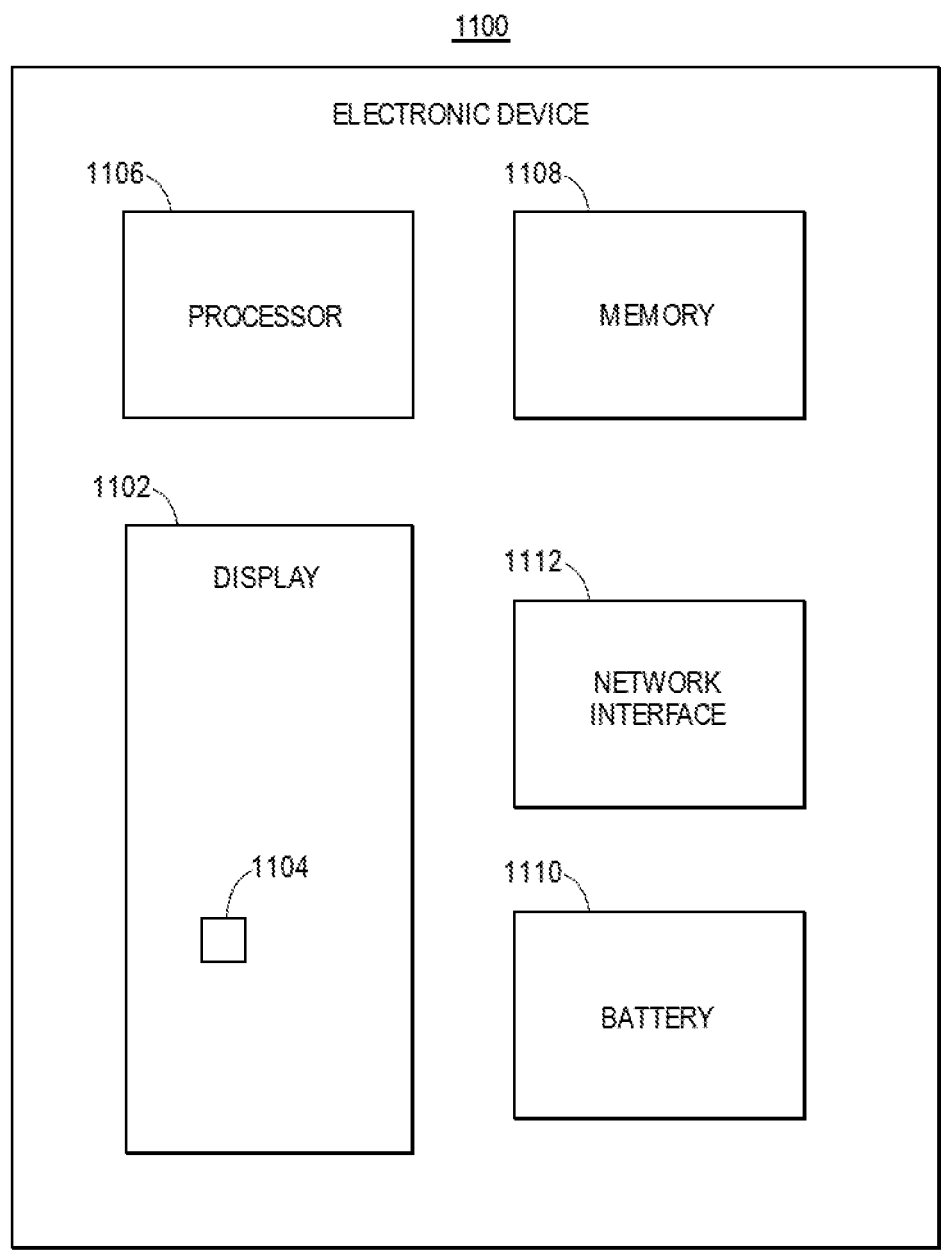
FIG. 11 is an electronic device having a display, in accordance with embodiments of the present disclosure.

FIG. 11 is an electronic device having a display, in accordance with embodiments of the present disclosure. Referring to FIG. 11, an electronic device 1100 has a display or display panel 1102 with a micro-structure 1104. The display may also have glass layers and other layers, circuitry, and so forth. The display panel 1102 may be a micro-LED display panel. As should be apparent, only one microstructure 1104 is depicted for clarity, though a display panel 1102 will have an array or arrays of microstructures including nanowire LEDs.

The electronic device 1100 may be a mobile device such as smartphone, tablet, notebook, smartwatch, and so forth. The electronic device 1100 may be a computing device, stand-alone display, television, display monitor, vehicle computer display, the like. Indeed, the electronic device 1100 may generally be any electronic device having a display or display panel.

The electronic device 1100 may include a processor 1106 (e.g., a central processing unit or CPU) and memory 1108. The memory 1108 may include volatile memory and nonvolatile memory. The processor 1106 or other controller, along with executable code store in the memory 1108, may provide for touchscreen control of the display and well as for other features and actions of the electronic device 1100.

In addition, the electronic device 1100 may include a battery 1110 that powers the electronic device including the display panel 1102. The device 1100 may also include a network interface 1112 to provide for wired or wireless coupling of the electronic to a network or the internet. Wireless protocols may include Wi-Fi (e.g., via an access point or AP), Wireless Direct®, Bluetooth®, and the like. Lastly, as is apparent, the electronic device 1100 may include additional components including circuitry and other components.

Thus, embodiments described herein include low temperature thin film transistors and micro light-emitting diode displays having low temperature thin film transistors.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes a gate electrode on an insulator structure. A channel material layer is over the gate electrode and extends beyond a first side and a second side of the gate electrode. The channel material layer includes a crystalline Group III-P material. A first conductive contact is on a portion of the channel material layer extending beyond the first side of the gate electrode. A second conductive contact is on a portion of the channel material layer extending beyond the second side of the gate electrode.

Example Embodiment 2

The integrated circuit structure of example embodiment 1, wherein the crystalline Group III-P material is a binary material selected from the group consisting of indium phosphide (InP) and gallium phosphide (GaP).

Example Embodiment 3

The integrated circuit structure of example embodiment 1, wherein the crystalline Group III-P material is a ternary material selected from the group consisting of indium gallium phosphide (InGaP) and indium arsenic phosphide (InAsP).

Example Embodiment 4

The integrated circuit structure of example embodiment 1, 2 or 3, wherein the crystalline Group III-P material is single crystalline or polycrystalline.

Example Embodiment 5

The integrated circuit structure of example embodiment 1, 2, 3 or 4, further including a gate dielectric layer between the gate electrode and the channel material layer.

Example Embodiment 6

The integrated circuit structure of example embodiment 5, wherein the gate dielectric layer includes a layer of a high-k dielectric material in direct contact with the channel material layer.

Example Embodiment 7

An integrated circuit structure includes an insulator structure above a substrate. The insulator structure includes one or more fins, individual ones of the fins having a top and sidewalls. A channel material layer is on the top and sidewalls of the individual ones of the fins of the insulator structure, the channel material layer including a crystalline Group III-P material. A gate electrode is over a first portion of the channel material layer, the gate electrode having a first side opposite a second side. A first conductive contact is adjacent the first side of the gate electrode, the first conductive contact over a second portion of the channel material layer. A second conductive is contact adjacent the second side of the gate electrode, the second conductive contact over a third portion of the channel material layer.

Example Embodiment 8

The integrated circuit structure of example embodiment 7, wherein the crystalline Group III-P material is a binary material selected from the group consisting of indium phosphide (InP) and gallium phosphide (GaP).

Example Embodiment 9

The integrated circuit structure of example embodiment 7, wherein the crystalline Group III-P material is a ternary material selected from the group consisting of indium gallium phosphide (InGaP) and indium arsenic phosphide (InAsP).

Example Embodiment 10

The integrated circuit structure of example embodiment 7, 8 or 9, wherein the crystalline Group III-P material is single crystalline or polycrystalline.

Example Embodiment 11

The integrated circuit structure of example embodiment 7, 8, 9 or 10, further including a gate dielectric layer between the gate electrode and the first portion of the channel material layer.

Example Embodiment 12

The integrated circuit structure of example embodiment 11, wherein the gate dielectric layer includes a layer of a high-k dielectric material directly on the channel material layer.

Example Embodiment 13

The integrated circuit structure of example embodiment 7, 8, 9, 10, 11 or 12, further including a first dielectric spacer between the first conductive contact and the first side of the gate electrode, the first dielectric spacer over a fourth portion of the channel material layer, and a second dielectric spacer between the second conductive contact and the second side of the gate electrode, the second dielectric spacer over a fifth portion of the channel material layer.

Example Embodiment 14

An integrated circuit structure includes an insulator structure above a substrate. The insulator structure has a trench therein, the trench having sidewalls and a bottom. A channel material layer is in the trench in the insulator structure, the channel material layer conformal with the sidewalls and bottom of the trench. A gate dielectric layer is on the channel material layer in the trench, the gate dielectric layer conformal with the channel material layer. A gate electrode is on the gate dielectric layer in the trench, the gate electrode having a first side opposite a second side and having an exposed top surface. A first conductive contact is laterally adjacent the first side of the gate electrode, the first conductive contact on a first portion of the channel material layer. A second conductive contact is laterally adjacent the second side of the gate electrode, the second conductive contact on a second portion of the channel material layer.

Example Embodiment 15

The integrated circuit structure of example embodiment 14, further including a third conductive contact over and in contact with the exposed top surface of the gate electrode.

Example Embodiment 16

The integrated circuit structure of example embodiment 14 or 15, wherein the first conductive contact is in a second trench in the insulator structure, and the second conductive contact is in a third trench in the insulator structure.

Example Embodiment 17

The integrated circuit structure of example embodiment 14, 15 or 16, wherein the crystalline Group III-P material is a binary material selected from the group consisting of indium phosphide (InP) and gallium phosphide (GaP).

Example Embodiment 18

The integrated circuit structure of example embodiment 14, 15 or 16, wherein the crystalline Group III-P material is a ternary material selected from the group consisting of indium gallium phosphide (InGaP) and indium arsenic phosphide (InAsP).

Example Embodiment 19

The integrated circuit structure of example embodiment 14, 15, 16, 17 or 18, wherein the crystalline Group III-P material is single crystalline or polycrystalline.

Example Embodiment 20

The integrated circuit structure of example embodiment 14, 15, 16, 17, 18 or 19, wherein the gate dielectric layer includes a layer of a high-k dielectric material directly on the channel material layer.

Example Embodiment 21

A backplane of a micro light emitting diode pixel structure includes a glass substrate having an insulating layer thereon. A plurality of pixel thin film transistor circuits is in and on the insulating layer. Each of the pixel thin film transistor circuits includes a gate electrode and a channel material layer, the channel material layer including a crystalline Group III-P material.

Example Embodiment 22

The backplane of example embodiment 21, wherein the crystalline Group III-P material is a binary material selected from the group consisting of indium phosphide (InP) and gallium phosphide (GaP).

Example Embodiment 23

The backplane of example embodiment 21, wherein the crystalline Group III-P material is a ternary material selected from the group consisting of indium gallium phosphide (InGaP) and indium arsenic phosphide (InAsP).

Example Embodiment 24

The backplane of example embodiment 21, 22 or 23, wherein each of the pixel thin film transistor circuits is to drive at least one micro light emitting diode device.

What is claimed is:

1. An integrated circuit structure, comprising:
    a gate electrode on an insulator structure;
    a channel material layer over the gate electrode and extending beyond a first side and a second side of the gate electrode, the channel material layer comprising a crystalline Group III-P material;
    a first conductive contact on a portion of the channel material layer extending beyond the first side of the gate electrode; and
    a second conductive contact on a portion of the channel material layer extending beyond the second side of the gate electrode.

2. The integrated circuit structure of claim 1, wherein the crystalline Group III-P material is a binary material selected from the group consisting of indium phosphide (InP) and gallium phosphide (GaP).

3. The integrated circuit structure of claim 1, wherein the crystalline Group III-P material is a ternary material selected from the group consisting of indium gallium phosphide (InGaP) and indium arsenic phosphide (InAsP).

4. The integrated circuit structure of claim 1, wherein the crystalline Group III-P material is single crystalline or polycrystalline.

5. The integrated circuit structure of claim 1, further comprising:
    a gate dielectric layer between the gate electrode and the channel material layer.

6. The integrated circuit structure of claim 5, wherein the gate dielectric layer comprises a layer of a high-k dielectric material in direct contact with the channel material layer.

7. An integrated circuit structure, comprising:
    an insulator structure above a substrate, the insulator structure comprising one or more fins, individual ones of the fins having a top and sidewalls;
    a channel material layer on the top and sidewalls of the individual ones of the fins of the insulator structure, the channel material layer comprising a crystalline Group III-P material;
    a gate electrode over a first portion of the channel material layer, the gate electrode having a first side opposite a second side;
    a first conductive contact adjacent the first side of the gate electrode, the first conductive contact over a second portion of the channel material layer; and
    a second conductive contact adjacent the second side of the gate electrode, the second conductive contact over a third portion of the channel material layer.

8. The integrated circuit structure of claim 7, wherein the crystalline Group III-P material is a binary material selected from the group consisting of indium phosphide (InP) and gallium phosphide (GaP).

9. The integrated circuit structure of claim 7, wherein the crystalline Group III-P material is a ternary material selected from the group consisting of indium gallium phosphide (InGaP) and indium arsenic phosphide (InAsP).

10. The integrated circuit structure of claim 7, wherein the crystalline Group III-P material is single crystalline or polycrystalline.

11. The integrated circuit structure of claim 7, further comprising:

a gate dielectric layer between the gate electrode and the first portion of the channel material layer.

12. The integrated circuit structure of claim 11, wherein the gate dielectric layer comprises a layer of a high-k dielectric material directly on the channel material layer.

13. The integrated circuit structure of claim 7, further comprising:
 a first dielectric spacer between the first conductive contact and the first side of the gate electrode, the first dielectric spacer over a fourth portion of the channel material layer; and
 a second dielectric spacer between the second conductive contact and the second side of the gate electrode, the second dielectric spacer over a fifth portion of the channel material layer.

14. An integrated circuit structure, comprising:
 an insulator structure above a substrate, the insulator structure having a trench therein, the trench having sidewalls and a bottom;
 a channel material layer in the trench in the insulator structure, the channel material layer conformal with the sidewalls and bottom of the trench;
 a gate dielectric layer on the channel material layer in the trench, the gate dielectric layer conformal with the channel material layer;
 a gate electrode on the gate dielectric layer in the trench, the gate electrode having a first side opposite a second side and having an exposed top surface;
 a first conductive contact laterally adjacent the first side of the gate electrode, the first conductive contact on a first portion of the channel material layer; and
 a second conductive contact laterally adjacent the second side of the gate electrode, the second conductive contact on a second portion of the channel material layer.

15. The integrated circuit structure of claim 14, further comprising:
 a third conductive contact over and in contact with the exposed top surface of the gate electrode.

16. The integrated circuit structure of claim 14, wherein the first conductive contact is in a second trench in the insulator structure, and the second conductive contact is in a third trench in the insulator structure.

17. The integrated circuit structure of claim 14, wherein the crystalline Group III-P material is a binary material selected from the group consisting of indium phosphide (InP) and gallium phosphide (GaP).

18. The integrated circuit structure of claim 14, wherein the crystalline Group III-P material is a ternary material selected from the group consisting of indium gallium phosphide (InGaP) and indium arsenic phosphide (InAsP).

19. The integrated circuit structure of claim 14, wherein the crystalline Group III-P material is single crystalline or polycrystalline.

20. The integrated circuit structure of claim 14, wherein the gate dielectric layer comprises a layer of a high-k dielectric material directly on the channel material layer.

21. A backplane of a micro light emitting diode pixel structure, the backplane comprising:
 a glass substrate having an insulating layer thereon; and
 a plurality of pixel thin film transistor circuits in and on the insulating layer, each of the pixel thin film transistor circuits comprising a gate electrode and a channel material layer, the channel material layer comprising a crystalline Group III-P material.

22. The backplane of claim 21, wherein the crystalline Group III-P material is a binary material selected from the group consisting of indium phosphide (InP) and gallium phosphide (GaP).

23. The backplane of claim 21, wherein the crystalline Group III-P material is a ternary material selected from the group consisting of indium gallium phosphide (InGaP) and indium arsenic phosphide (InAsP).

24. The backplane of claim 21, wherein each of the pixel thin film transistor circuits is to drive at least one micro light emitting diode device.

* * * * *